(12) United States Patent
Ghoshal

(10) Patent No.: US 7,293,416 B2
(45) Date of Patent: Nov. 13, 2007

(54) COUNTERFLOW THERMOELECTRIC CONFIGURATION EMPLOYING THERMAL TRANSFER FLUID IN CLOSED CYCLE

(75) Inventor: Uttam Ghoshal, Austin, TX (US)

(73) Assignee: NanoCoolers, Inc., Austin, TX (US)

( * ) Notice: Subject to any disclaimer, the term of this patent is extended or adjusted under 35 U.S.C. 154(b) by 371 days.

(21) Appl. No.: 11/020,355

(22) Filed: Dec. 23, 2004

(65) Prior Publication Data

US 2006/0137359 A1   Jun. 29, 2006

(51) Int. Cl.
  *F25B 21/02* (2006.01)
(52) U.S. Cl. ............................................. 62/3.7; 62/3.2
(58) Field of Classification Search .................. 62/3.2, 62/3.6, 3.7, 259.1
  See application file for complete search history.

(56) References Cited

U.S. PATENT DOCUMENTS

| | | | |
|---|---|---|---|
| 3,633,217 A | 1/1972 | Lance |
| 3,654,528 A | 4/1972 | Barkan |
| 4,065,936 A | 1/1978 | Fenton et al. |
| 4,125,122 A | 11/1978 | Stachurski |
| 4,177,015 A | 12/1979 | Davidson |
| 4,688,147 A | 8/1987 | Ono |
| 5,009,399 A | 4/1991 | Bykhovsky et al. |
| 5,184,211 A | 2/1993 | Fox |
| 5,640,046 A | 6/1997 | Suzuki et al. |
| 5,867,990 A | 2/1999 | Ghoshal |
| 5,943,211 A | 8/1999 | Havey |
| 5,993,164 A | 11/1999 | Diaz |
| 6,000,225 A | 12/1999 | Ghoshal |
| 6,021,844 A | 2/2000 | Batchelder |
| 6,065,293 A | 5/2000 | Ghoshal |
| 6,105,381 A | 8/2000 | Ghoshal |
| 6,119,463 A | 9/2000 | Bell |
| 6,146,103 A | 11/2000 | Lee et al. |
| 6,161,388 A | 12/2000 | Ghoshal |
| 6,175,495 B1 | 1/2001 | Batchelder |
| 6,222,113 B1 | 4/2001 | Ghoshal |
| 6,223,539 B1 | 5/2001 | Bell |
| 6,227,809 B1 | 5/2001 | Forster et al. |
| 6,241,480 B1 | 6/2001 | Chu et al. |
| 6,256,996 B1 | 7/2001 | Ghoshal |
| 6,266,962 B1 | 7/2001 | Ghoshal |

(Continued)

FOREIGN PATENT DOCUMENTS

JP    360004244 A    1/1985

(Continued)

OTHER PUBLICATIONS

D.M. Rowe (ed.), *CRC Handbook of Thermoelectrics*, CRC Press (New York), 1995, pp. 479-488.

(Continued)

*Primary Examiner*—Melvin Jones
(74) *Attorney, Agent, or Firm*—Zagorin O'Brien Graham LLP

(57) ABSTRACT

Active cooling technologies such as thermoelectrics can be used to introduce thermal "gain" into a cooling system and, when employed in combination with forced flow liquid metal cooling loops, can provide an attractive solution for cooling high heat flux density devices and/or components. Total cooling power can be increased by employing multiple thermoelectric elements. Indeed, by employing modern semiconductor technologies, including e.g., thin-film technologies, thermoelectric elements may be cost-effectively employed and configured in large arrays.

66 Claims, 16 Drawing Sheets

U.S. PATENT DOCUMENTS

| | | |
|---|---|---|
| 6,282,907 B1 | 9/2001 | Ghoshal |
| 6,300,150 B1 | 10/2001 | Venkatasubramanian |
| 6,338,251 B1 | 1/2002 | Ghoshal |
| 6,384,312 B1 | 5/2002 | Ghoshal |
| 6,388,185 B1 | 5/2002 | Fleurial et al. |
| 6,452,740 B1 | 9/2002 | Ghoshal |
| 6,467,279 B1 | 10/2002 | Backman et al. |
| 6,474,074 B2 | 11/2002 | Ghoshal |
| 6,494,048 B1 | 12/2002 | Ghoshal et al. |
| 6,505,468 B2 | 1/2003 | Venkatasubramanian |
| 6,588,217 B2 | 7/2003 | Ghoshal |
| 6,597,544 B2 | 7/2003 | Ghoshal |
| 6,598,403 B1 | 7/2003 | Ghoshal |
| 6,598,405 B2 | 7/2003 | Bell |
| 6,606,866 B2 | 8/2003 | Bell |
| 6,608,250 B2 | 8/2003 | Ghoshal |
| 6,613,602 B2 | 9/2003 | Cooper et al. |
| 6,614,109 B2 | 9/2003 | Cordes et al. |
| 6,625,990 B2 | 9/2003 | Bell |
| 6,637,210 B2 | 10/2003 | Bell |
| 6,658,860 B2 * | 12/2003 | McGrew ................ 62/3.7 |
| 6,658,861 B1 | 12/2003 | Ghoshal et al. |
| 6,672,076 B2 | 1/2004 | Bell |
| 6,700,052 B2 | 3/2004 | Bell |
| 6,708,501 B1 | 3/2004 | Ghoshal et al. |
| 6,712,258 B2 | 3/2004 | Ghoshal |
| 6,740,600 B2 | 5/2004 | Ghoshal et al. |
| 2003/0005706 A1 | 1/2003 | Bell |
| 2003/0029173 A1 | 2/2003 | Bell |
| 2003/0079770 A1 | 5/2003 | Bell |
| 2004/0020206 A1 | 2/2004 | Sullivan et al. |
| 2004/0020217 A1 | 2/2004 | Bell |
| 2004/0031514 A1 | 2/2004 | Bell |
| 2004/0182088 A1 * | 9/2004 | Ghoshal et al. ........... 62/3.7 |
| 2004/0234379 A1 | 11/2004 | Miner et al. |
| 2004/0234392 A1 | 11/2004 | Ghoshal et al. |
| 2005/0160752 A1 | 7/2005 | Ghoshal et al. |
| 2006/0137360 A1 | 6/2006 | Ghoshal |
| 2006/0137361 A1 | 6/2006 | Ghoshal |

FOREIGN PATENT DOCUMENTS

| | | |
|---|---|---|
| JP | 06188582 A | 7/1994 |
| JP | 07321265 A | 12/1995 |

OTHER PUBLICATIONS

V. Zakordonets and G. Loginov, "Thermoelectric figure of merit of monopolar semiconductors with finite dimensions," *Semiconductors*, vol. 31, pp. 265-267, Mar. 1997.

S. Tada, R. Echigo, H. Yoshida, "A New Concept of Porous Thermoelectric Module Using a Reciprocating Flow for Cooling / Heating System," 16th International Conference on Thermoelectrics, IEEE, Dresden, DE, pp. 664-667, Aug. 1997.

A. Bejan (ed.), *Advanced Engineering Thermodynamics*, 2nd Edition, John Wiley & Sons, Inc. (New York), 1997, pp. 675-682.

M. Coey and D. Weaire, "Magnets, Markets and Magic Cylinders", The Industrial Physicist, vol. 4, No. 3, Sep. 1998, pp. 34-36.

M. Bartkowiak and G. Mahan, "Boundary Effects in Thin Film Thermoelectrics," Materials Research Society Symposium Proceedings, vol. 545, pp. 265-273, 1999.

Tellurex Corporation, "Frequently Asked Questions," http://www.tellurex.com, © 2002, printed Dec. 1, 2004.

Tellurex Corporation, "Frequently Asked Questions about Thermoelectric Power Generation," http://www.tellurex.com, © 2003, printed Dec. 1, 2004.

A. Miner and U. Ghoshal, "Cooling of high-power-density microdevices using liquid metal coolants," *Appl. Phys. Letters*, vol. 85, No. 3, pp. 506-508, Jul. 19, 2004.

* cited by examiner $$\Delta T_{COOLER} \leq \frac{T_H - T_C}{2}$$

COUNTERFLOW THERMOELECTRIC CONFIGURATION EMPLOYING THERMAL TRANSFER FLUID IN CLOSED CYCLE

BACKGROUND

1. Field of the Invention

The present invention relates to thermal transfer systems, and more particularly, to thermoelectric array configurations in which counterflows of a thermal transfer fluid are employed in a closed-cycle thermal transfer system.

2. Description of the Related Art

Electronic devices such as central processing units, graphic-processing units and laser diodes can generate substantial heat during operation. If such heat is not dissipated properly, temperature buildup may occur and such buildup can adversely affect the performance of these devices. For example, excessive temperature buildup may lead to malfunctioning or breakdown of the devices. Alternatively, stability or performance characteristics may be adversely affected. Accordingly, it is important to remove the generated heat in order to maintain desired operating temperatures of these devices.

In many challenging scientific and commercial cooling applications, particularly microelectronics, cooling of high power dissipation densities (e.g., densities >100 W/cm$^2$) may be required. Worse still, these densities are projected to increase in the future. In general, such applications require cooling beyond what can be offered by conventional finned heat sink structures and forced air cooling. Consequently, alternatives such as single- and two-phase fluid cooling systems are being implemented more widely.

Characteristics such as low vapor pressure and high thermal conductivity make liquid metals attractive for high temperature cooling applications. Commonly-owned U.S. Pat. No. 6,658,861, entitled "Cooling of High Power Density Devices by Electrically Conducting Fluids" describes various exemplary liquid metal cooling configurations. In certain configurations, heat is transferred from a high power density device to the liquid metal, the liquid metal is transported away from the high power density device and heat is distributed and/or dissipated at a convenient distance (e.g., using a heat sink).

In addition to providing excellent heat transfer characteristics, the high electrical conductivity typical in this class of fluids offers the potential of efficient, compact pumping. Accordingly, liquid metals offer an attractive solution for current and future high power density cooling challenges. However, even with all the advantages of efficient forced flow liquid metal cooling, some cooling applications may require greater cooling power than can be achieved simply through simple rejection of heat from the liquid metal to an ambient environment. While ever larger heat sinks and forced air techniques can be employed to improve dissipation to the ambient environment, form factor or other constraints may limit these solutions. For these and other applications, improved techniques are desired.

SUMMARY

Active cooling technologies such as thermoelectrics can be used to introduce thermal "gain" into a cooling system and, when employed in combination with forced flow liquid metal cooling loops, can provide an attractive solution for cooling high heat flux density devices and/or components. Total cooling power can be increased by employing multiple thermoelectric elements. Indeed, by employing modern semiconductor technologies, including e.g., thin-film technologies, thermoelectric elements may be cost-effectively employed and configured in large arrays.

In some such configurations, it has been discovered that it is advantageous to configure closed loop fluid flows such that hot-side and cold-side flows provide substantially uniform thermal differentials across respective thermoelectric elements (or substantially isothermal groups thereof) during operation. In some configurations (particularly linear configurations), counterdirectional fluid flows may be employed to achieve substantially uniform thermal differentials. In some configurations, other flow topologies (including crossflows) may be employed. Generally, an N-stage array or subarray may provide substantially uniform thermal differentials if flow topology is structured so that, at any particular thermoelectric module, the impinging hot-side and cold-side flows respectively traverse x and N-1-x stages {x: 0≦x<N} enroute to the particular thermoelectric module. Based on the description herein, persons of ordinary skill in the art will appreciate a variety of flow topologies suitable to a given array geometry.

In some configurations, hot-side and cold-side flows are part of respective and distinct closed loops. In some configurations, hot-side and cold-side flows are parts of a same or unified closed loop. In some configurations, hot-side and cold-side closed loop flows at least partially overlap.

In some configurations, it is desirable to substantially equilibrate temperature of liquid metal flows entering hot-side and cold-side paths. Various suitable recuperator designs are described including designs that provide heat exchange with and without mixture of respective flows.

Configurations described herein may include (or be charged with) liquid metal (or an alternative thermal transfer fluid) or may simply be adapted for its use in a closed cycle system. In addition, while embodiments of the present invention are described primarily with respect to cooling configurations, based on the description herein, persons of ordinary skill in the art will appreciate that the described techniques and configurations may be employed or adapted for use in other heat transfer applications including heating, temperature regulation, and even power generation based on thermal differential. These and other embodiments and exploitations will be understood with reference to the specification and claims that follow.

BRIEF DESCRIPTION OF THE DRAWINGS

The present invention may be better understood, and its numerous objects, features, and advantages made apparent to those skilled in the art by referencing the accompanying drawings.

FIG. 1A shows a TE element made of a p-type material. FIG. 1B shows the analogous structure of a TE element made of an n-type material.

The use of the same reference symbols in different drawings indicates similar or identical items.

DESCRIPTION OF THE PREFERRED EMBODIMENT(S)

Figure 1A:
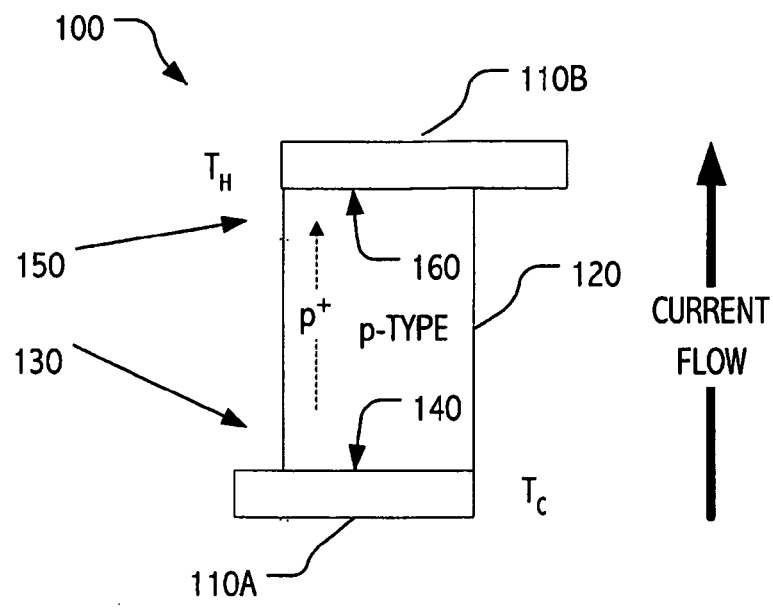
FIGS. 1A and 1B depict individual Peltier-type thermoelectric (TE) elements. In particular.

In the description that follows, we detail systems that employ arrays of thermoelectric modules in conjunction with one or more closed fluid cycle loops in which a forced flow of thermal transfer fluid (e.g., a liquid metal thermal transfer fluid) is used to transfer thermal energy to or from the thermoelectric modules. Topologies of the thermal transfer fluid flows are designed to provide substantially uniform thermal differentials across respective ones of the thermoelectric modules. In cooling (or heating) configurations, such topologies provide substantially uniform thermal differentials across thermoelectric modules of an array and allow each of the thermoelectric modules to operate in a desired efficiency regime, while accumulating in the thermal transfer fluid flow the heat transfer contributed by each of the thermoelectric modules.

Thermoelectric devices and materials are well-known in the art and a wide variety of configurations, systems and exploitations thereof will be appreciated by those skilled in the art. In general, exploitations include those in which a thermal potential is developed as a consequence of an electromotive force (typically voltage) across an appropriate material, material interface or quantum structure, as well as those in which an electromotive force (typically voltage) results from a thermal potential across an appropriate material, material interface or quantum structure.

Often, exploitations of the first type operate based on the Peltier effect, while exploitations of the second type often operate based on the Seebeck effect. Peltier effects arise at interfaces between dissimilar conductive (or semiconductive) materials, while Seebeck effects arise in materials where a temperature gradient gives rise to current flow. However, more generally, other effects or actions may be similarly exploited, including related or similar effects (e.g., Thomson, magneto caloric, quantum, tunneling and thermoionic effects) in materials, at material interfaces or as a result of quantum scale confinement. Accordingly, for purposes of the present description, the term "thermoelectric" (e.g., thermoelectric module, couple, element, device, material etc.) is meant in the broadest sense of the term in which thermal potential is traded for electromagnetic potential (or vice versa), and therefore includes those thermoelectric configurations which exploit Peltier or Seebeck effects, as well as those that operate based upon Thomson, quantum tunneling, thermoionic, magneto caloric or other similar effect or combination of effects. That said, for clarity of description, we focus on particular Peltier-type thermoelectric systems; however, based on such description, persons of ordinary skill in the art will appreciate applications of the described inventive concepts to configurations in which other thermoelectric-type effects are employed.

In addition to the range of variation on suitable thermoelectric-type effects, persons of ordinary skill in the art will appreciate (based on the description herein), that various of the techniques and configurations described herein may be employed to provide cooling, heating, heating and cooling, thermal regulation, and/or power generation. While these and other exploitations may fall within the scope of claims that follow, we believe it is useful to focus on certain illustrative embodiments to provide a clear description. Therefore, we focus our description on exemplary cooling configurations in which the Peltier effect is exploited to provide cooling power. For concreteness, we describe systems in which thermal energy is transported away from a high power density device, such as an operating microprocessor, integrated circuit, laser, etc. using one or more liquid metal thermal transfer fluid loops. Other fluids may be employed and the techniques and configurations described herein may be employed in cooling, heating, thermal regulation, and/or power generation.

Accordingly, in view of the above and without limitation, we now describe operation of typical Peltier-type devices, analyze efficiency factors for refrigerators and detail techniques and configurations whereby various counterflow configurations may be employed in a system configured to cool a high-power density device. Based on the exemplary configurations, persons of ordinary skill in the art will appreciate suitable adaptations for other cooling applications as well as for heating, thermal regulation, and/or power generation exploitations.

Peltier-Type Thermoelectric Elements, Couples and Modules

Figure 1B:
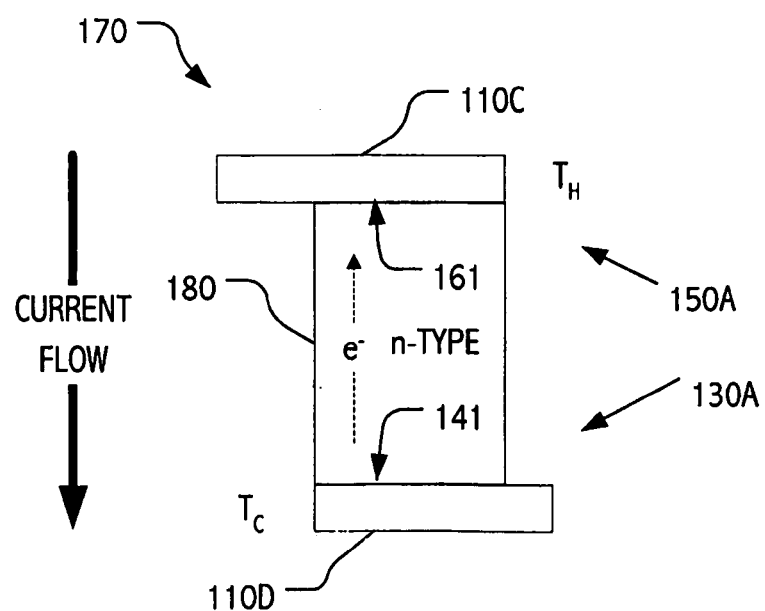

FIGS. 1A and 1B depict individual Peltier-type thermoelectric (TE) elements 100 and 170. In particular, FIG. 1A shows a TE element 100 made of a p-type semiconductor or semimetal material. Current flows from electrical contact 110A through p-type material 120 to electrical contact 110B. Carriers are generated at the cold junction or interface 140 between the electrical contact 110A material and the p-type material 120, absorbing heat at the "cold" end 130 of the TE element. These carriers flow toward the "hot" end 150 of TE element 100 and condense at the hot junction or interface 160, where they release heat. Carriers in p-type materials are positively charged holes, so the current flows from cold end 130 to hot end 150, whence it flows through a second electrical contact 110B to the surrounding electrical circuit.

FIG. 1B shows the analogous structure of a TE element 170 made of an n-type semiconductor or semimetal material. Current flows from electrical contact 110C through n-type material 180 to electrical contact 110D. Carriers are again generated at the cold junction or interface 141 between the electrical contact 110D material and the n-type material 180, absorbing heat at cold end 130 of the TE element. These carriers flow toward hot end 150 of the TE element and condense at the hot junction or interface 161, where they release heat. Carriers in n-type materials are negatively charged electrons, so the direction of current is from hot side 150 to cold side 130.

Figure 2:
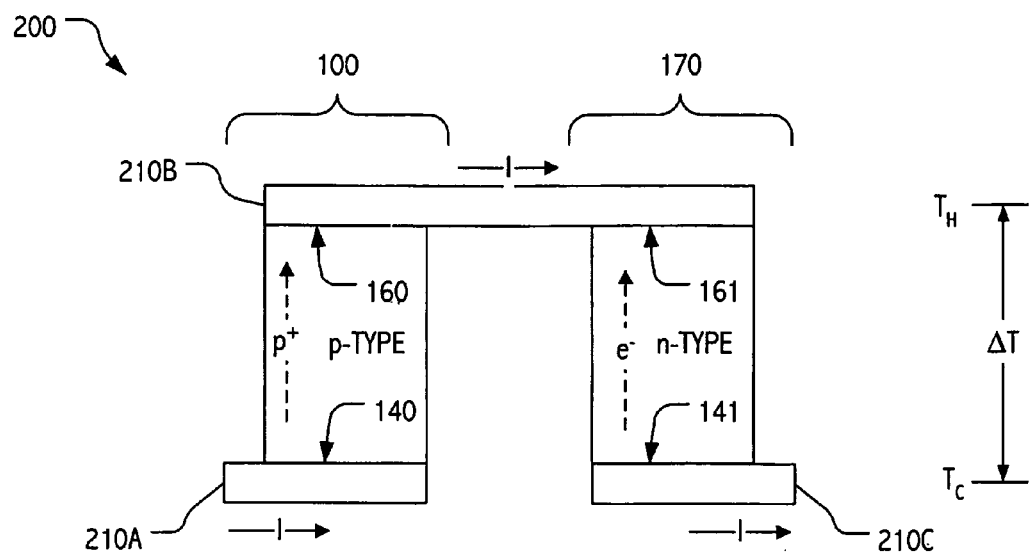
FIG. 2 shows a TE couple formed by arranging two individual complementary TE elements in a configuration in which they are electrically in series and thermally in parallel.

FIG. 2 shows a TE couple 200, formed by arranging two individual complementary TE elements such as TE elements 100 and 170 (above) in a configuration in which they are electrically in series and thermally in parallel. Current flows from an electrical contact 210A at the cold end 130 of TE element 100 through the p-type material 120, through electrical contact 210B at the hot end 150, and through n-type material 180 to electrical contact 210C at the cold end 130 of TE element 170. Carriers (holes) are generated at the cold junction or interface 140 between the electrical contact 210A material and the p-type material 120, absorbing heat. These carriers flow toward the hot end 150 of the TE element 100 and condense at the hot junction or interface 160 between p-type material 120 and electrical contact 210B material, where they release heat. Electrons generated at cold junction or interface 141 flow to the hot junction or interface 161 between the electrical contact 210B material and the n-type material 180, where they condense and release heat.

In both p-type 100 and n-type 170 TE elements, respective carriers are generated at the cold junctions or interfaces (140, 141) and flow toward the hot junctions or interfaces (160, 161) where they condense or recombine. Therefore, by arranging TE elements of alternating carrier type and connecting them in an electrical series configuration, we maintain a single current flow through the TE elements which thermally act in parallel. A temperature difference, $\Delta T$, between hot end and cold end temperatures $T_H$ and $T_C$ is achieved during operation of TE couple 200.

Figure 3:
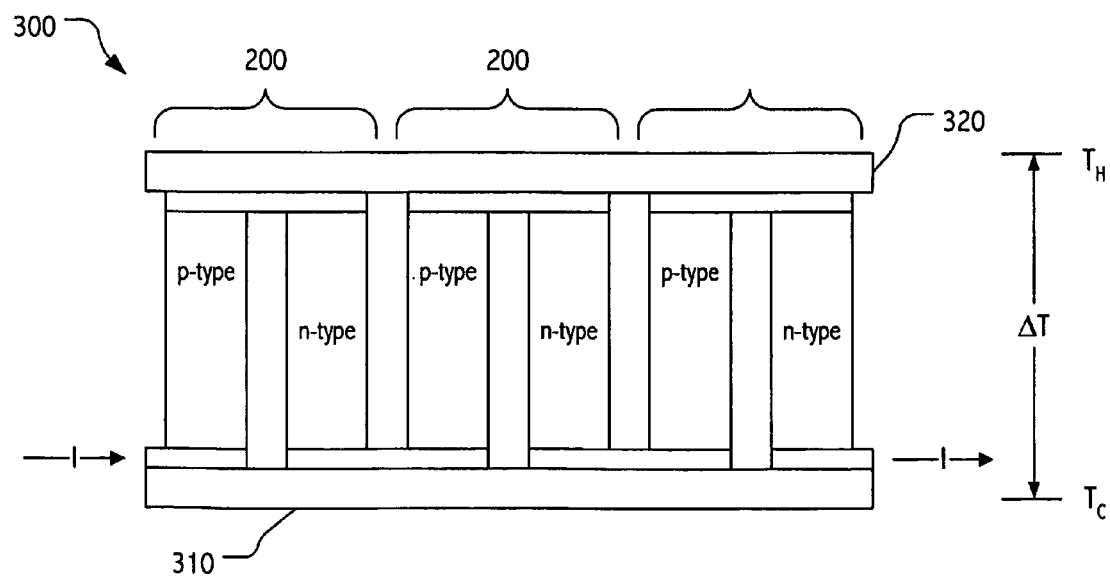
FIG. 3 illustrates a TE module that includes multiple TE couples.

FIG. 3 illustrates a TE module 300 that thermally couples three (3) TE couples 200 that are electrically connected in series. A thermal contact 310 is placed in thermal communication with the cold sides 130 of each of the TE couples 200 to define a substantially isothermal cold end that, during operation, achieve a cold end temperature $T_C$. A similar thermal contact 320 is placed in thermal communication with the hot sides 150 of each of the TE couples 200 to define a substantially isothermal hot end that, during operation, achieve a hot end temperature $T_H$.

Thermal contacts 310 and 320 should be designed or configured to couple thermal energy to/from respective ends of TE couples 200 without shunting electrical current that would otherwise traverse the TE elements. That is, thermal contacts 310 and 320 (together with any intermediate layers at interfaces 311, 321) should act as a thermal conductor and electrical insulator. In general, appropriate materials, layers and/or coating selections are application dependent and persons of ordinary skill in the art will recognize suitable selections for a given application.

While the preceding description has assumed general p-type and n-type semiconductor or semimetal materials, particular materials or material systems are typically employed in configurations that exploit particular thermoelectric-type effects. In general, appropriate material selections are based on the particular thermoelectric-type effects exploited and may be optimized for operating temperatures, compatibility with other materials and other factors. Focusing illustratively on Peltier-type thermoelectrics, devices are commonly fabricated at bulk material scale for use at near room temperatures using semiconductors such as bismuth telluride (BiTe), indium antimony (InSb) and related material systems plated with metal (e.g., Cu) to define the appropriate material interfaces.

As described above, both p-type and n-type materials are employed in practical configurations. A class of materials commonly employed in Peltier-type thermoelectrics is that known as the bismuth chalcogenides. For example, $Bi_{0.5}Sb_{1.5}Te_3$ can be employed as a p-type material and $Bi_2Te_{3-x}Se_x$ as n-type material. Other materials and material systems may be employed depending on design goals, desired operating temperatures and material compatibility issues particular to a given application. In general, the configurations and techniques described herein may be employed with thermoelectric modules of any suitable design and based on any suitable materials or material systems.

While operation of suitable Peltier-type thermoelectric elements, couples and modules will be understood based on the preceding discussion, persons of ordinary skill in the art will recognize that many practical implementations may correspond to the illustrated structures. Neither rectilinear structures nor linear configurations thereof are required. Indeed, many practical configurations include patterned thin or thick film structures fabricated using modern semiconductor processes.

Based on the description herein, persons of ordinary skill in the art will recognize a variety of suitable integrated circuit realizations that generally correspond to the configurations illustrated. Commonly owned, co-pending U.S. patent application Ser. No. 11/020,531, filed Dec. 23, 2004, entitled "MONOLITHIC THIN-FILM THERMOELECTRIC DEVICE INCLUDING COMPLEMENTARY THERMOELECTRIC MATERIALS" and naming Samavedam, Ghoshal, Ngai and Miner as inventors; and Ser. No. 10/756,603, filed Jan. 13, 2004, entitled "THERMOELECTRIC DEVICES" and naming Ghoshal as inventor each describe suitable semiconductor integrated circuit realizations.

Efficiency Analysis

The efficiency of all refrigerators, including Peltier-type thermoelectric coolers, is limited by the second law of thermodynamics which states that it is not possible for the entropy of a system as a whole to decrease as the result of any process. For refrigerators this means that, while one can cool one part of a system and thereby reduce the entropy of that subsystem, the entropy of another part of the system must increase. Practically speaking, it takes energy to cool things below their equilibrium temperature.

Figure 4:
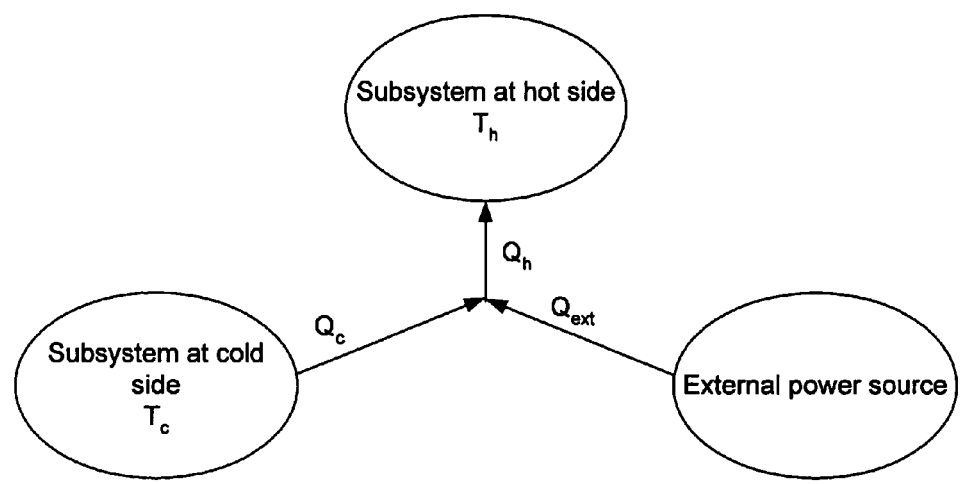
FIG. 4 is a conceptual schematic illustrating the operation of an ideal cooling system, or refrigerator.

FIG. 4 shows a very simple cooling system. From the first law of thermodynamics, the energy of the entire system must remain constant. Therefore, the heat, $Q_h$, dissipated by the system at the hot side of the cooling system at temperature $T_h$ is equal to the sum of the heat, $Q_c$, removed from the cold side at temperature $T_c$ and the energy, $Q_{ext}$, added by an external power source. We can state this alternatively as in Equation 1.

$$Q_{ext} = Q_h - Q_c \qquad (1)$$

The efficiency, $\eta_{ref}$, of a cooling system is defined as the cooling power, or the quantity of heat transported away from the item to be cooled ($Q_c$), per unit of power consumed to accomplish the cooling ($Q_{ext}$).

$$\eta_{ref} = \frac{Q_c}{Q_{ext}} \quad (2)$$

In the ideal case of a perfectly reversible cooling process this efficiency is equal to the absolute temperature at the cold side divided by the temperature difference between the hot and cold sides, $\Delta T$, or $$\eta_{ref} = \frac{Q_c}{Q_{ext}} = \frac{T_c}{T_h - T_c} = \frac{T_c}{\Delta T} \quad (3)$$

All real cooling systems are, of course, less efficient than this, but two important points become clear by examining the results for an ideal refrigerator. The first is that as the temperature of the cold side, $T_c$, is reduced the efficiency also drops. The second point is that as the temperature difference between the two sides, $\Delta T$, goes to zero the efficiency of the cooler tends toward infinity. (Of course, as the temperature difference goes to zero no cooling can be accomplished.) In other words, cooling is most efficient when the temperature differential remains small. For both these reasons, refrigerators work less efficiently, that is, they require more energy to operate, as the temperature of the cold side diverges from that of the hot side.

Peltier-type thermoelectric coolers have no moving parts and so are quiet and reliable, requiring little maintenance. They also are small and lightweight, and can be controlled electronically to maintain a precise temperature. Because of these advantages, they are useful in a wide variety of niche applications, especially electronics applications, such as cooling laser diodes and computer electronics. Unfortunately, even with the best materials available today, Peltier coolers have far lower efficiencies than do traditional cooling devices, such as the compressor in a household refrigerator. Therefore, modifying the operation of thermoelectric (TE) coolers to improve their efficiency would be of great benefit and would allow the use of TE coolers and cooling systems in additional applications, including those requiring higher cooling power.

Figure 5:
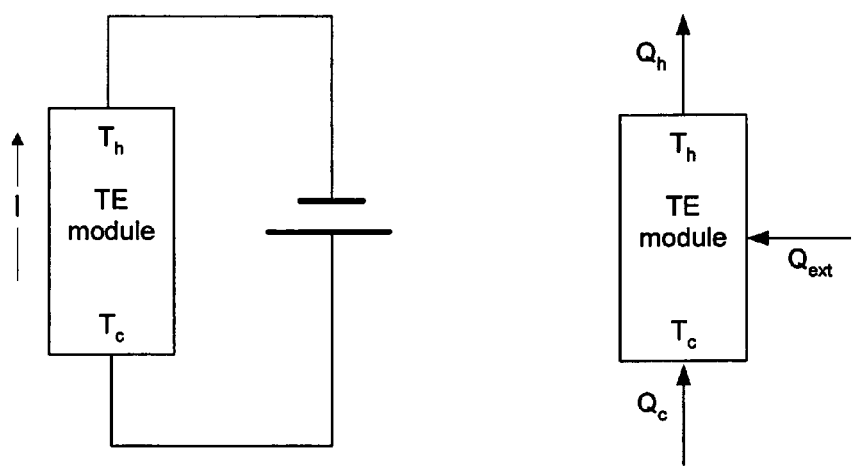
FIG. 5 is a conceptual schematic demonstrating the operating principles of a TE cooling system, with reference to the ideal cooling system of FIG. 4.

FIG. 5 shows a conceptual diagram of a TE cooling element made of a heavily doped semiconductor or semimetal. The left part of the diagram shows the electrical connections while the right part depicts the thermal relationships.

Three processes contribute to the heat flow through a thermoelectric element. First, at each junction heat is generated when a current flows from one material to a dissimilar one. The magnitude of this Peltier effect is proportional to the current, the absolute temperature of the junction, and material-dependent properties. Equations 4 and 5 describe this contribution mathematically.

$$Q_{TE,cold} = ST_c I \quad (4)$$

$$Q_{TE,hot} = ST_h I \quad (5)$$

where the subscripts "hot" and "cold" refer to the side for which the heat flow is being calculated, the subscript "TE" refers to the origin of the heat flow (Peltier or thermoelectric effect), S is the Seebeck coefficient (a property of the TE material), $T_h$ is the temperature at the hot side of the element, $T_c$ is the temperature at the cold side of the element, and I is the current flowing through the electrical circuit.

In the bulk of the TE element, as in any resistive element, Joule heating occurs. Its magnitude is $$Q_{joule} = I^2 R \quad (6)$$

where the subscript "Joule" refers to the origin of the heat flow (Joule heating), and R is the resistance of the element. Experiments have shown that about half of this heat flows to the cold side and half to the hot side of the element.

Finally, thermal conduction carries heat from hotter to colder regions of the TE element, and its contribution is given by $$Q_{cond,cold} = -\kappa \Delta T \quad (7)$$

$$Q_{cond,hot} = -\kappa \Delta T \quad (8)$$

where the subscript "cond" refers to the origin of the heat flow (thermal conduction) and $\kappa$ is the thermal conductance of the TE material. Taking the Joule heating contribution at each junction as half the total flow and summing these contributions we get $$Q_h = Q_{TE,hot} + Q_{Joule,hot} + Q_{cond,hot} = ST_h I + \frac{1}{2}I^2 R - \kappa \Delta T \quad (9)$$

$$Q_c = Q_{TE,cold} + Q_{Joule,cold} + Q_{cond,cold} = ST_c I - \frac{1}{2}I^2 R - \kappa \Delta T \quad (10)$$

$$Q_{ext} = Q_h - Q_c = S \Delta T I + I^2 R \quad (11)$$

The efficiency of the cooler is then $$\eta_{ref} = \frac{Q_c}{Q_{ext}} = \frac{ST_c I - \frac{1}{2}I^2 R - \kappa \Delta T}{S \Delta T I + I^2 R} \quad (12)$$

The efficiency of the cooler is a strong function of current, so one can find an optimal current, $I_{opt}$, and calculate the efficiency at that current, $\eta_{max}$, as shown in the following Equations 13 and 14.

$$I_{opt} = \frac{S \Delta T}{R\left(\sqrt{1 + Z\overline{T}} - 1\right)} \quad (13)$$

$$\eta_{max} = \left[\frac{T_c}{\Delta T}\right] \cdot \left[\frac{\sqrt{1 + Z\overline{T}} - T_h/T_c}{\sqrt{1 + Z\overline{T}} + 1}\right] \quad (14)$$

where $$\overline{T} = \frac{1}{2}(T_h + T_c)$$

is the mean, or average, temperature of the TE element, $$Z = \frac{S^2}{\kappa R},$$

and ZT is a dimensionless figure of merit for thermoelectric materials, with higher values of ZT yielding higher efficiency coolers.

From Equation 14 it is clear that efficiency can be improved by increasing ZT and reducing ΔT, the temperature difference between the hot and cold sides of the TE element. Near room temperature, where Peltier coolers are often operated, and for values of ZT typical of TE cooler materials, a reduction in ΔT increases the efficiency more rapidly than an increase in ZT of the same magnitude. Furthermore, materials used in thermoelectric coolers have a fairly narrow range of ZT over their effective operating range and, while the search for better materials continues, it is currently more practical to adjust the temperature difference to improve efficiency.

To provide appropriate magnitudes of cooling power, it can be desirable to configure large arrays coolers (e.g., thermoelectric elements, typically as arrays of thermoelectric modules) in a way that accumulates the cooling power contributions of the individual elements (or modules). In doing so, it becomes important to design a system in which each of the thermoelectric elements (or modules) operates in a desired efficiency regime. Below, we describe a variety of counterflow loop configurations in which we can achieve uniformly low ΔT across each of the thermoelectric elements (or modules) of an array.

While the preceding discussion of efficiency has focused on refrigerators, rather than heaters or power generation exploitations, persons of ordinary skill in the art will recognize that the desirability of maintaining a generally uniform ΔT across each of the elements of an array applies similarly to such exploitations. While uniformly low ΔT is a figure of merit for cooling (or heating) array applications, it can be shown that, in the case of power generation exploitation, maximizing ΔT (within appropriate system and material constraints) is desirable. For example, with respect to power generation, it can be shown that efficiency at an optimal current is a function of ΔT.

$$\eta_{power} = \left[\frac{\Delta T}{T_c}\right] \cdot \left[\frac{\sqrt{1-Z\overline{T}}-1}{\sqrt{1+Z\overline{T}}+T_h/T_c}\right] \quad (15)$$

Accordingly, while we focus illustratively of arrays of thermoelectric coolers and counterflow closed-cycle fluid loop configurations, persons of ordinary skill in the art will appreciate applications and exploitations to heating, heating/cooling, temperature regulation and/or power generation applications. In view of the above, and without limitation, we now described certain exemplary configurations.

Counterflow Loop Configurations

We now describe a variety of configurations in which arrays of thermoelectric modules are employed in conjunction with one or more closed cycle fluid loops. Forced flow of thermal transfer fluid is used to transfer thermal energy to or from the thermoelectric modules. In some configurations, the thermal transfer fluid is a liquid metal or other conductive fluid or slurry and flow is motivated using a magnetofluiddynamic (MFD) pump.

In general, topologies of the thermal transfer fluid flows are designed to provide substantially uniform thermal differentials across respective ones of the thermoelectric modules. In cooling or heating configurations, such topologies provide substantially uniform thermal differentials across thermoelectric modules of an array and allow each of the thermoelectric modules to operate in a desired efficiency regime, while accumulating in the thermal transfer fluid flow the heat transfer contributed by each of the thermoelectric modules. In power generation configurations, uniformity of thermal differentials ensures that each thermoelectric module operates in a substantially equivalent efficiency regime. In cooling (or heating) configurations, a recuperator may be employed in combination with the counterflow topologies to limit the magnitude of thermal differential (ΔT) across any given thermoelectric module and thereby improve efficiency.

For clarity of illustration, the thermoelectric array configurations and loop topologies of FIGS. 6A, 7, 8 and 11 are presented in a linear form which will facilitate understanding of the counterflows. However, based on the description herein, persons of ordinary skill in the art will recognize that more complex topologies, including serpentine topologies and crossbows in multidimensional arrays, are also contemplated. Such topological generalizations will be better understood based on description that follows; however, we begin our description with simpler linear presentations as follows.

Figure 6A:
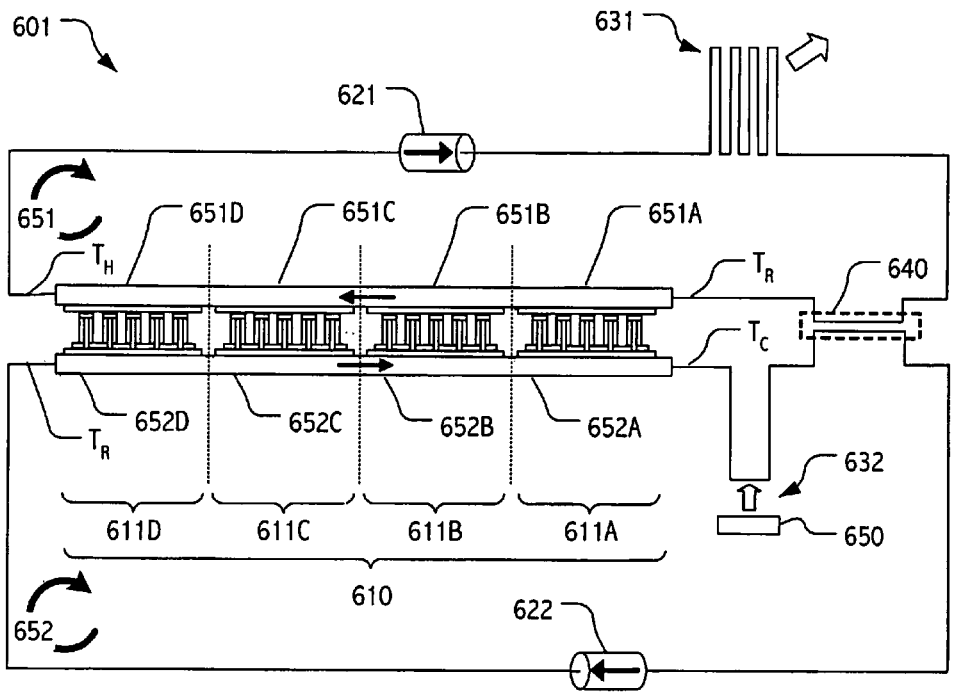
FIG. 6A depicts a counterflow thermoelectric cooler configuration in accordance with some embodiments of the present invention in which two distinct closed-cycle thermal transfer fluid loops are provided.

FIG. 6A depicts an exemplary counterflow thermoelectric cooler configuration 601 in which two distinct thermal transfer fluid loops are provided. A first loop 651 includes respective portions 651A, 651B, 651C and 651D in thermal communication with hot ends of respective thermoelectric modules 611A, 611B, 611C and 611D. Flow of thermal transfer fluid through loop 651 is motivated by pump 621. Similarly, a second loop 652 includes respective portions 652D, 652C, 652B and 652A in thermal communication with cold ends of respective thermoelectric modules 611D, 611C, 611B and 611A. Flow of thermal transfer fluid through loop 652 is motivated by pump 622.

For purposes of illustration, we assume that thermal transfer fluid(s) in either or both of loops 651 and 652 is (are) a liquid metal or other conductive fluid or slurry and that pumps 621 and/or 622 include(s) electromagnetic pumps, such as a magnetofluiddynamic pump described elsewhere herein. In some realizations, the thermal transfer fluid is an alloy of gallium and indium. However, persons of ordinary skill in the art will recognize that other thermal transfer fluids and/or pump configurations may be employed in other realizations.

In the illustrated cooling configuration, heat is transferred from hot ends of respective thermoelectric modules to the liquid metal thermal transfer fluid flow in loop 651. Liquid metal thermal transfer fluid enters portion 651A of the closed cycle fluid loop 651 at a temperature $T_R$. As the fluid flows through portions 651A, 651B, 651C and 651D of loop 651, heat is transferred from hot end ends of respective thermoelectric modules and the fluid exits portion 651D at a temperature $T_H$. From there, the liquid metal thermal transfer fluid flows past or through heat exchanger 631, giving up thermal energy and returning to reenter portion 651A of loop 651, completing the closed cycle fluid loop. Operation of recuperator 640 will be described below.

Turning now to the cold-side flow of thermoelectric cooler configuration 601, liquid metal thermal transfer fluid exits portion 652A of closed cycle fluid loop 652 at a temperature $T_C$, flowing past or through heat exchanger 632 and picking up thermal energy from the cooled workpiece 650, typically a microprocessor, communications integrated circuit, optoelectronic device or array, laser or high power density device. Flow continues through recuperator 640, which will be described below, and back to thermoelectric array 610. Liquid metal thermal transfer fluid enters portion 652D of the closed cycle fluid loop 652 at a temperature $T_R$. As the fluid flows through portions 651A, 651B, 651C and 651D of loop 651, heat is transferred from the fluid to cold ends of respective thermoelectric modules and the fluid eventually exits portion 651D at a temperature $T_H$, completing the closed cycle fluid loop.

In general, heat exchangers 631 and 632 are any form of heat exchanger appropriate for a particular exploitation of the described counterflow thermoelectric cooler configuration. For example, in some realizations, heat exchanger 631 is an ambient air heat exchanger (e.g., including a finned heat sink and optionally a forced blower or fan) at some distance from the thermoelectric modules. In some realizations, heat exchanger 632 is a solid-fluid heat exchanger including a thermally conductive surface in close thermal communication with cooled workpiece 650 together with a housing through which the liquid metal thermal transfer fluid may flow. For processor chip cooling applications, the thermally conductive surface may be a thin-film tungsten, nickel layer on the backside of the processor or a discrete surface of tungsten, nickel, anodized aluminum or nickel-coated aluminum soldered to the backside of the chip. Suitable housing materials generally include inert polymers (Teflon, polyurethane, etc.), glass or thermally conductive material such as tungsten, nickel, nickel-coated aluminum, anodized aluminum, nickel-coated copper etc.

Recuperator 640 includes a fluid-fluid heat exchanger that substantially equilibrates temperatures (at $T_R$) of thermal transfer fluid flows entering respective portions 651A and 652D of loops 651 and 652. In general, any of a variety of thermally conductive surfaces such as such as tungsten, nickel, nickel-coated aluminum, anodized aluminum, nickel-coated copper, etc. may be employed. By employing recuperator 640, the illustrated thermoelectric cooler configuration 601, ensures a relatively low thermal differential ($\Delta T$) across any given thermoelectric module.

As described above with reference to efficiency analysis, reduction of $\Delta T$ can allow individual Peltier-type thermoelectric elements of the illustrated TE modules to operate (when employed in a thermoelectric cooling or heating configuration) at efficiencies approaching ideal efficiencies for the particular material systems and devices employed. Of course, thermoelectric efficiency in other thermoelectric system exploitations of the designs and techniques illustrated (e.g., thermoelectric systems in which a thermal potential between hot-side and cold-side flows is exploited to generate electrical power) may not exhibit similar inverse dependence on $\Delta T$. Indeed in some such configurations, it may be desirable to increase (or maximize within appropriate system and/or material limits) $\Delta T$. Accordingly, in such configurations, recuperator 640 may be omitted.

Similarly, while high power density devices (HPDDs) may constitute the substantial source of thermal differential between hot-side and cold-side flows in certain of the illustrated configurations, in other exploitations, a cooling or heating target need not include a HPDD. Indeed, heat-pump and refrigeration configurations are contemplated and power generation configurations in which a thermal source need not constitute a HPDDs are all contemplated.

Figure 6B:
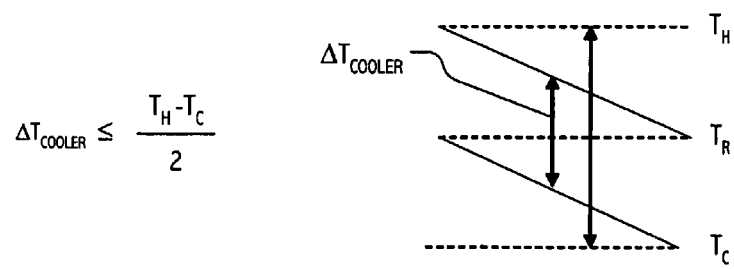
FIGS. 6B and 6C illustrate thermal differentials in a configuration such as that depicted in FIG. 6A.
Figure 6C:
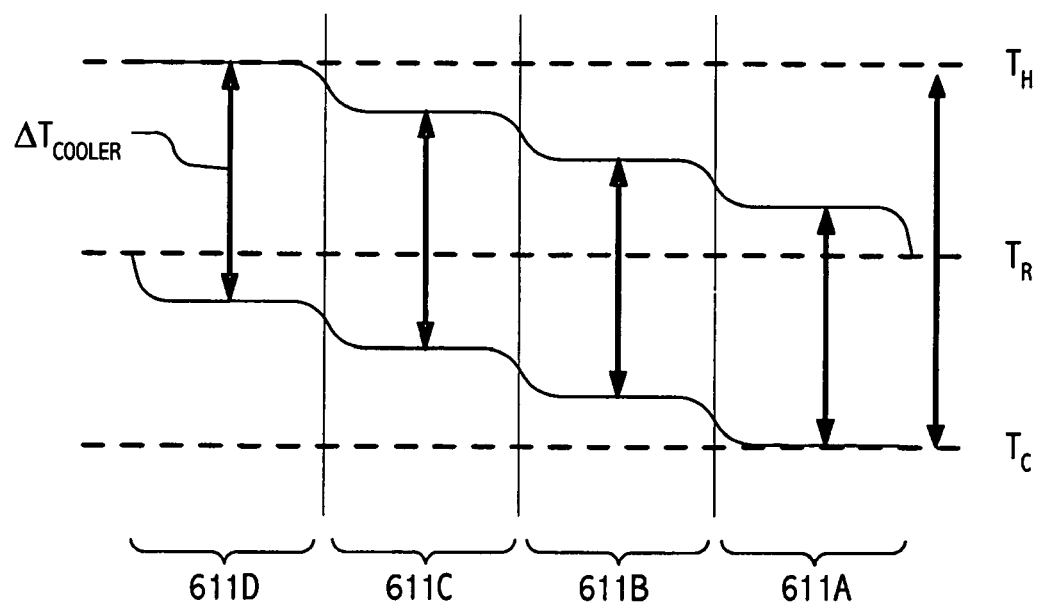

FIG. 6B is a simplified dimensionless depiction of the effect of the illustrated recuperated counterflows on temperature of the thermal transfer fluid flows and thermal differential ($\Delta T$) across any given thermoelectric module or element. While FIG. 6B tends to ignore generally isothermal hot- and cold-end temperatures of a multi-element thermoelectric module configured as illustrated in FIG. 3, FIG. 6C provides a more detailed illustration in relation to thermal differentials across thermoelectric modules 611D, 611C, 611B and 611A. In each case, the use of counterflows provides a generally uniform thermal differential ($\Delta T$) across the thermoelectric modules and inclusion of recuperator 640 tends to minimize magnitude of that generally uniform $\Delta T$.

As previously discussed, any of a variety of thermal transfer fluids and/or pump configurations may be employed in other realizations of the closed-cycle counterflows of FIG. 6A. However, electrically conductive thermal transfer fluids are attractive in that they allow the direct use of magnetofluiddynamic-(MFD-) type electromagnetic pumps. MFD pumps are often more reliable than other kinds of pumps since MFD pumps typically do not have moving parts (except, of course, the conductive fluid itself) and may offer certain system advantages since typical MFD pump configurations are orientation-independent and vibration insensitive.

In general, suitable designs for pumps 621 and 622 include MFD pump designs that include a chamber or path through which a conductive fluid may flow, a fluid inlet, and a fluid outlet. Operation of such an MFD pump will be understood as follows. A magnetic field is created within at least a portion of the chamber path, oriented in a direction generally perpendicular to the desired direction of fluid flow. Respective electrodes are disposed on generally opposing sides of the chamber or path such that a current flowing through the conductive fluid between the electrodes flows in a direction that is generally perpendicular to both the magnetic field and the desired direction of fluid flow.

While any of a variety of MFD pump designs may be employed and particular MFD pump configurations will, in general, be selected based on application specific factors, details of several suitable designs are described in co-pending U.S. application Ser. No. 11/020,530, filed Dec. 23, 2004, entitled "Integrated Electromagnetic Pump and Power Supply Module" and naming Uttam Ghoshal, Key Kolle, and Andrew Carl Miner as inventors, the disclosure of which is hereby incorporated by reference in its entirety.

Turning now to thermal transfer fluid formulations, any of a variety of formulations may be employed in realizations of the closed-cycle counterflows of FIGS. 6A, 7, 8, 9 and 11. Nonetheless, certain liquid metal formulations are attractive for realizations such as described herein. In particular, alloys of gallium and indium can be employed. Compositions ranging from 65 to 75% (by mass) gallium and 20 to 25% (by mass) indium are generally suitable and materials such as tin, copper, zinc and bismuth may also be present in small percentages. One such composition for a suitable liquid metal thermal transfer fluid is 66% gallium, 20% indium, 11% tin, 1% copper, 1% zinc and 1% bismuth.

While an appropriate thermal transfer fluid selection will, in general, vary from application to application, GaIn alloys are often suitable for configurations such as described herein, in part because, such alloys tend to perform well over a wide range of temperatures with high thermal and electrical conductivities. Melting points ranging from −15° C. to 30° C. can often be achieved and typical GaIn alloys do not form vapor even at temperatures up to 2000° C. Such alloys are typically non-toxic, are relatively cheap and are inert to polyimides, polycarbonates, glass, alumina, Teflon, and conducting metals such as tungsten, molybdenum, and nickel. As a result, such materials can be used in forming the closed-cycle fluid loops 651 and 652.

It will be apparent to those skilled in the art, that a number of other thermal transfer fluids, including other liquid metals may be employed. For example, liquid metals having high thermal conductivity, high electrical conductivity and high volumetric heat capacity can be used. Some examples of liquid metals that can be used in an embodiment of the invention include mercury, gallium, sodium potassium eutectic alloy (78% sodium, 22% potassium by mass), bismuth tin alloy (58% bismuth, 42% tin by mass), bismuth lead alloy (55% bismuth, 45% lead) etc. Bismuth based alloys are generally used at high temperatures (40 to 140° C.). Pure indium can be used at temperatures above 156° C. (i.e., the melting point of indium).

In the configuration of FIG. 6A, placements of pumps 621 and 622 are illustrative. In general, any of a variety of placements may be suitable. Typically, form factor, power supply proximity, EMI, thermal compatibility and other factors specific to a particular design will suggest an appropriate placement.

Figure 7:
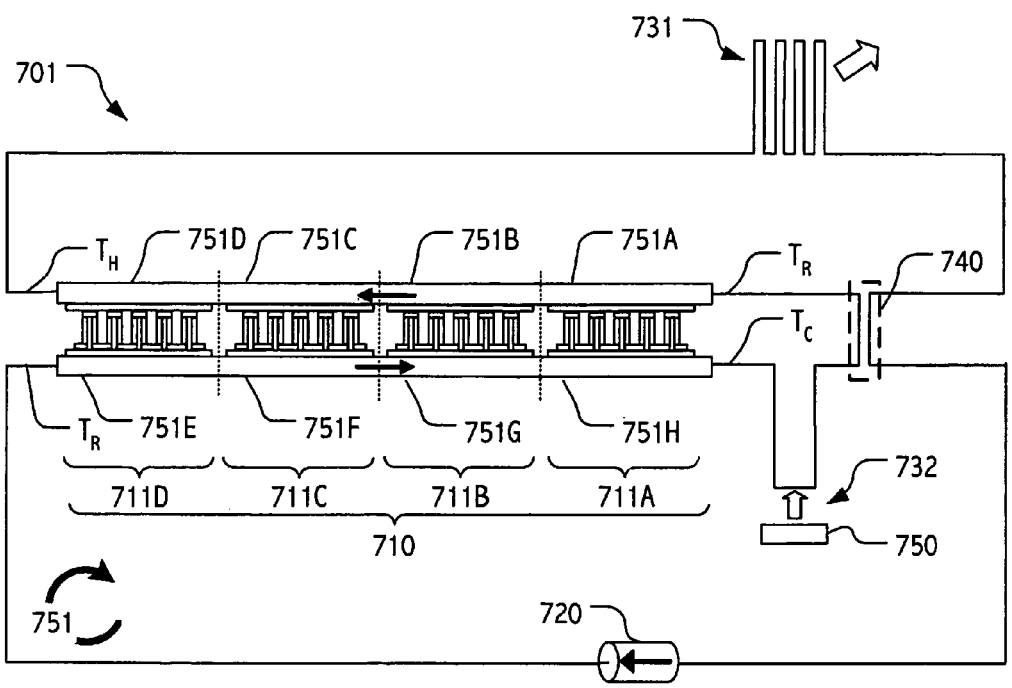
FIG. 7 depicts a counterflow thermoelectric cooler configuration in accordance with some embodiments of the present invention in which a single closed-cycle thermal transfer fluid loop is provided.

FIG. 7 depicts a counterflow thermoelectric cooler configuration 701 in which a single closed-cycle thermal transfer fluid loop traverses both hot- and cold-sides of a thermoelectric array. For economy of description, structures and configurations that are identical, common with or generally similar to those described with reference to a previously described configuration (or suitable for inclusion therein) are not again described with reference to FIG. 7. Instead, we highlight the major structural and/or operational changes.

In the illustrated configuration, a single closed-cycle thermal transfer fluid loop traverses both hot- and cold-sides of a thermoelectric array. As a result, the configuration allows thermal transfer fluid motivation using a single pump, such as pump 720. As before, we assume that the thermal transfer fluid in loop 751 is a liquid metal or other conductive fluid or slurry and that pump 720 includes an electromagnetic pump, such as a magnetofluiddynamic pump described elsewhere herein. In some realizations, the thermal transfer fluid is an alloy of gallium and indium. However, as before, persons of ordinary skill in the art will recognize that other thermal transfer fluids and/or pump configurations may be employed in other realizations.

Referring to FIG. 7, a closed-cycle fluid loop 751 includes portions 751A, 751B, 751C and 751D in thermal communication with hot ends and portions 751E, 751F, 751G and 751H in thermal communication with cold ends of respective thermoelectric modules 711A, 711B, 711C and 711D. In the illustrated cooling configuration, heat is transferred from hot ends of respective thermoelectric modules to the liquid metal thermal transfer fluid flow in the closed-cycle fluid loop. Liquid metal thermal transfer fluid enters portion 751A of the closed cycle fluid loop 751 at a temperature $T_R$. As the fluid flows through portions 751A, 751B, 751C and 751D, heat is transferred from hot end ends of respective thermoelectric modules and the fluid exits portion 751D at a temperature $T_H$. From there, the liquid metal thermal transfer fluid flows past or through heat exchanger 731, giving up thermal energy and eventually arriving at the cold-side portion of closed-cycle loop 751.

After passing through recuperator 740, liquid metal thermal transfer fluid enters portion 751E at a temperature $T_R$. As the fluid flows through portions 751E, 751F, 751G and 751H of loop 751, heat is transferred from the fluid to cold ends of respective thermoelectric modules 711D, 711C, 711B and 711A. Liquid metal thermal transfer fluid exits portion 751H of loop 751 at a temperature $T_C$, flowing past or through heat exchanger 732 and picking up thermal energy from the cooled workpiece 750, typically a microprocessor, communications integrated circuit, optoelectronic device or array, laser or high power density device. Flow continues through recuperator 740, and back to thermoelectric array 710. After passing through recuperator 740, liquid metal thermal transfer fluid reenters portion 751A of loop 751 at a temperature $T_R$, thereby completing the closed cycle.

In the illustrated configuration, flow of thermal transfer fluid through loop 751 is motivated by a single pump 720. As before, placement of pump 720 is merely illustrative. In general, any of a variety of placements may be suitable. Typically, form factor, power supply proximity, EMI, thermal compatibility and other factors specific to a particular design will suggest an appropriate placement. Of course, multiple pumps may be employed if desired and a complete system may include multiple closed-cycle fluid loops without departing from the general design principals illustrated in FIG. 7. For example, multiple stages of cooling, heating or thermal transfer may be provided each with at least one respective closed cycle fluid loop. Also, multiple instances of a configuration such as illustrated in FIG. 7 may be arranged in parallel such that each includes a single closed-cycle thermal transfer fluid loop traverses both hot- and cold-sides of its respective thermoelectric array. These and other variations will be understood in the context of the appended claims.

Figure 8:
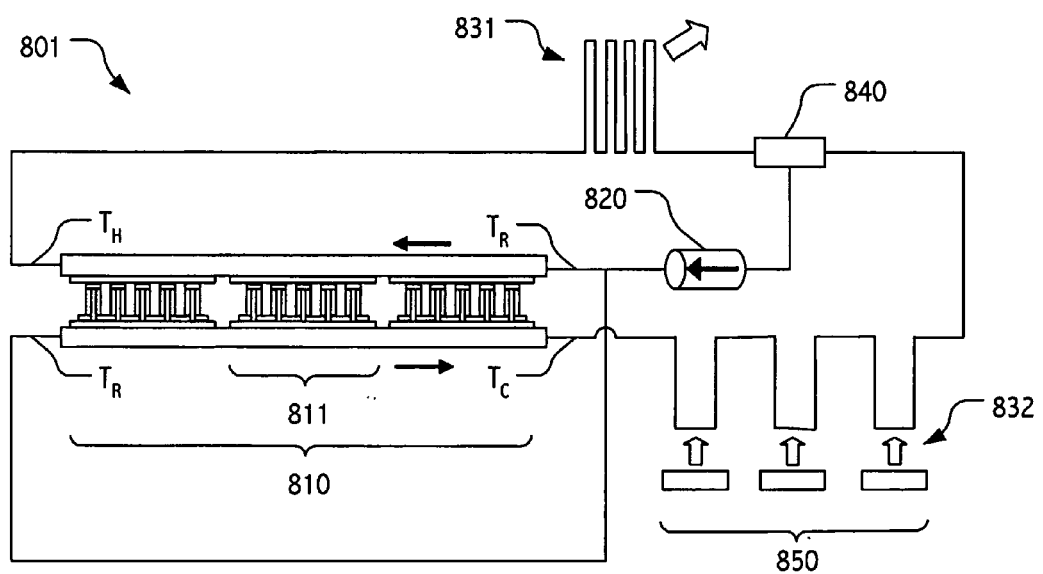
FIG. 8 depicts a counterflow thermoelectric cooler configuration in accordance with some embodiments of the present invention in which hot-side and cold-side flows through a closed-cycle thermal transfer system are commingled.

FIG. 8 depicts another variation in which hot-side and cold-side flows through a closed-cycle thermal transfer system are commingled. As before, structures and configurations that are identical, common with or generally similar to those described with reference to a previously described configuration (or suitable for inclusion therein) are not again described with reference to FIG. 8.

In the illustrated configuration, a closed-cycle flow of thermal transfer fluid path traverses both hot- and cold-sides of a thermoelectric array. As with the prior configuration, a single pump can suffice to motivate flow of the thermal transfer fluid. However, unlike the prior configuration, the motivated flow is split for hot- and cold-side portions of the closed-cycle fluid path and rejoined after flow past a respective heat exchanger (e.g., heat exchanger 831 for flow exiting the hot side portion and heat exchangers 832 for flow exiting the cold side portion).

In the illustrated configuration, rejoining occurs at recuperator 840 in which flows from the hot- and cold-side portions are commingled. Generally, a simple pool recuperator may be employed in which thermal transfer fluid flows of dissimilar temperatures enter conductive and/or convective heat transfer occurs, and one or more fluid flows exit at (or about) a recuperated mean temperature, $T_R$. However, given the heat transfer characteristics of liquid metal thermal transfer fluids, a simple commingling of flows thereof (e.g., in the flow path that includes pump 820) may exchange heat adequately to achieve a resulting $T_R$ flow without substantial localized thermal variations. As a result in some realizations, recuperative heat transfer may devolve to that achievable in a commingled flow portion of the closed-cycle fluid path (with or without flow path structures to accentuate mixing or turbulent flow). In such cases, a distinct recuperator 840 may be unnecessary and may be omitted. Of course, if a recuperator is provided, rejoining of flows could occur before entry to any such recuperator. In such case, fluid flowing from hot and cold sides of thermoelectric array 801 would be at least partially mixed even prior to entry and such a recuperator could be configured to damp out any remaining localized thermal variations. These and other variations will be appreciated by persons of ordinary skill in the art.

Referring then to FIG. 8, a closed-cycle fluid loop includes hot-side portions in thermal communication with hot ends of respective thermoelectric modules (such as TE module 811) and cold-side portions in thermal communication with cold ends of respective thermoelectric modules. In the illustrated cooling configuration, liquid metal thermal transfer fluid enters both hot-side and cold-side portions of the closed cycle fluid loop at a temperature $T_R$. As fluid flows through hot-side portions, heat is transferred from hot ends of respective thermoelectric modules and the fluid exits at a temperature $T_H$. From there, the liquid metal thermal transfer fluid flows past or through heat exchanger 831, giving up thermal energy and eventually rejoining flow from the cold-side portion of the closed-cycle fluid path. As fluid flows through cold-side portions, heat is transferred from the fluid to cold ends of respective thermoelectric modules and the fluid exits at a temperature $T_C$, flowing past or through heat exchangers 832 and picking up thermal energy from the cooled workpieces 850. Depiction of multiple work pieces 850 in a series flow configuration is purely illustrative. Single workpiece and other multiple workpiece flow topologies are envisioned in this and other ones of the illustrated thermoelectric loop configurations. In the particular configuration of FIG. 8, flow eventually rejoins that from the hot-side portion of the closed-cycle fluid path and arrives back at thermoelectric array 810 at a temperature $T_R$, thereby completing the closed cycle.

Figure 9:
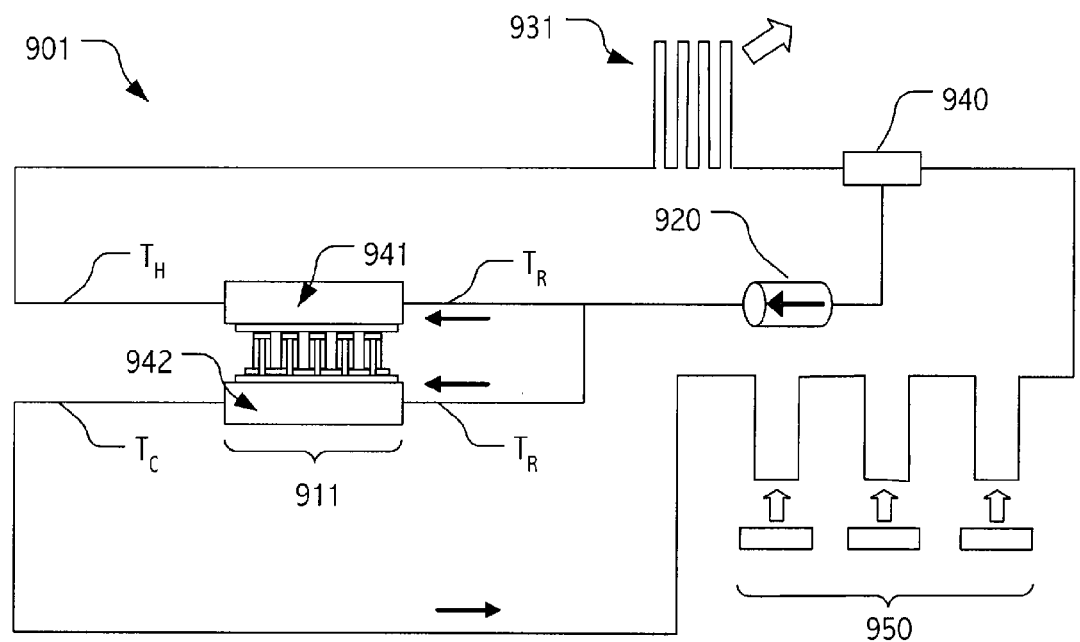
FIG. 9 depicts a thermoelectric cooler configuration in accordance with some embodiments of the present invention in which temporal integration of thermoelectric action is exploited.
Figure 11:
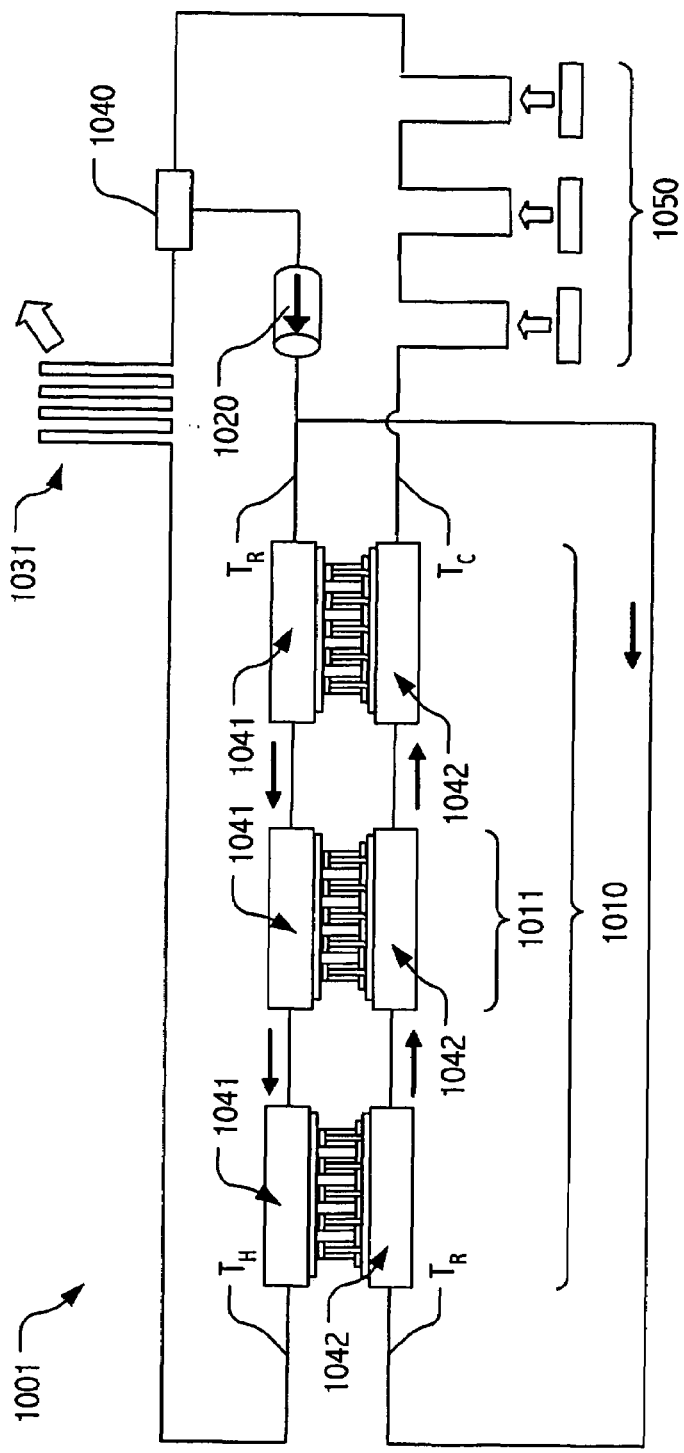
FIG. 11 depicts a counterflow thermoelectric cooler configuration in accordance with some embodiments of the present invention in which both temporal and spatial integration of thermoelectric action are exploited.

FIG. 9 depicts a thermoelectric cooler configuration 901 in which temporal integration of thermoelectric action is exploited. Forced fluid flow into heat exchanger 941 and 942 reservoirs is intermittent, introducing thermal transfer fluid of nominal temperature $T_R$ into respective reservoirs and allowing an amount thermal transfer fluid to dwell in therein and transfer heat from or to the respective hot or cold side of thermoelectric module 911. As before, thermal transfer fluid enters the portions of the closed cycle fluid pathway in communication with thermoelectric module 911 at a temperature $T_R$ and exits at $T_H$ or $T_C$. Integration of thermoelectric action of the single thermoelectric module 911 occurs over time (i.e., over the dwell time of thermal transfer fluid in respective reservoirs 941 and 942. Since only a single generally isothermal TE module is illustrated, counterflow is unnecessary and the illustrated flow topology has been simplified accordingly. In other configurations, such as illustrated in FIG. 11, counterflow may be desirable and can be provided.

Flows from the hot- and cold-side reservoirs 941 and 942 are eventually commingled in a recuperator (e.g., recuperator 940). As before, any of a variety of recuperators may be employed. For example, a simple pool recuperator may be employed in which thermal transfer fluid flows of dissimilar temperatures enter, conductive and/or convective heat transfer occurs, and one or more fluid flows exit at (or about) a recuperated mean temperature, $T_R$. Also as before, a simple commingling of flows of liquid metal thermal transfer fluid (e.g., without a distinct pool recuperator structure), may exchange heat adequately to achieve the desired recuperated ($T_R$) flow.

Figure 10:
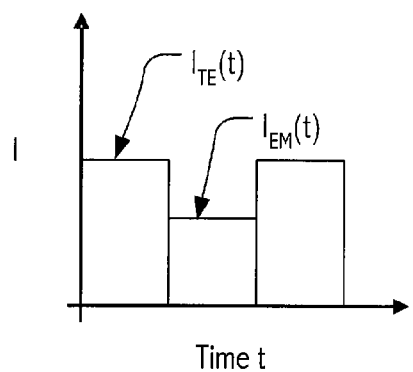
FIG. 10 depicts a power management technique in accordance with some embodiments of the present invention in which current demands of a thermoelectric and those of an electromagnetic pump appear in different intervals or phase.

As before, we assume that the thermal transfer fluid is a liquid metal or other conductive fluid or slurry and that pump 920 includes one or more electromagnetic pumps, such as a magnetofluiddynamic pump described elsewhere herein. In the illustrated configuration, it can be desirable to at least partially synchronize operation of pump 920 with that of thermoelectric module 911. For example, in some realizations, instantaneous current demands can be reduced by driving thermoelectric module 911 and an electromagnetic pump realization of pump 920 in differing intervals or phases. FIG. 10 illustrates one such configuration or mode of operation in which thermoelectric current ($I_{TE}$) and pump current ($I_{EM}$) demands occur in alternating phases of operation.

To emphasize use of the temporal integration, a single TE module is illustrated in FIG. 9. However, more generally, both spatial and temporal integration of thermoelectric action may be exploited in some realizations. See e.g., the illustration of FIG. 11 in which both temporal and spatial integration of thermoelectric action are exploited.

FIG. 11 depicts a counterflow thermoelectric cooler configuration 1001 in which intermittent or discontinuous flows of thermal transfer fluid result in both temporal and spatial integration of thermoelectric action of thermoelectric array 1010. The illustrated configuration is patterned after configuration previously described with reference to FIG. 8 in which hot-side and cold-side flows through a closed-cycle thermal transfer system a commingled. However, more generally, any of the previously illustrated counterflow loop configurations can be adapted (as now described) to incorporate temporal integration.

In the particular configuration illustrated in FIG. 11, a closed-cycle path for thermal transfer fluid flow splits to traverse both hot- and cold-sides of a thermoelectric array. Thermal transfer fluid of the hot side flow dwells momentarily at respective heat exchanger reservoirs (1041) and accumulates heat from hot-sides of respective thermoelectric modules 1011. Similarly, thermal transfer fluid of the cold side flow dwells momentarily at respective heat exchanger reservoirs (1042) and releases heat to cold-sides of respective thermoelectric modules 1011. As with the preceding configuration, a single pump can suffice to motivate flow (intermittently or discontinuously) and may be operated such that thermoelectric current ($I_{TE}$) and pump current ($I_{EM}$) demands occur in alternating phases of operation. Additionally, while a merged commingled flow of thermal transfer fluid configuration illustrated, persons of ordinary skill in the art will recognize that loop configurations akin to those presented in FIG. 6A (distinct hot-side and cold-side loops) and FIG. 8 (single closed-cycle loop traversing both hot- and cold-sides) may also be employed with intermittent or discontinuous fluid flow.

Topological Generalizations

While various counterflow thermoelectric array configurations have been illustrated with respect to linear arrangements that allow certain of the inventive concepts herein to be described with clarity, it will be apparent, based on the description herein, that a variety of topological generalizations may be applied to the linear counterflow arrangements illustrated. Two-dimensional arrays of thermoelectric modules are illustrative. In this regard, FIGS. 12-18 are plan view illustrations of a variety of two dimensional flow topologies that, like the linear counterflow arrangements previously illustrated, provide substantially uniform thermal differentials across respective array elements (or substantially isothermal groups thereof) during operation.

In describing these topological variations, we omit the loop configuration, heat exchanger, pump and recuperator details of the previously illustrated configurations, focusing instead on flow topologies in a small portion of the closed cycle fluid loop (or loops) of the thermoelectric system configurations described above with reference to FIGS. 6A, 7, 8, 9 and 11. In the illustrated two-dimensional portions of overall flow topologies, respective hot-side flows ($T_R$ to $T_H$) and cold-side flows ($T_R$ to $T_C$) are in thermal communication with thermoelectric modules of exemplary two-dimensional arrays thereof. Accordingly, based on the description herein of these two-dimensional topologies, persons of ordinary skill in the art will appreciate a variety of multidimensional thermoelectric array generalizations of the configurations previously illustrated.

Figure 12:
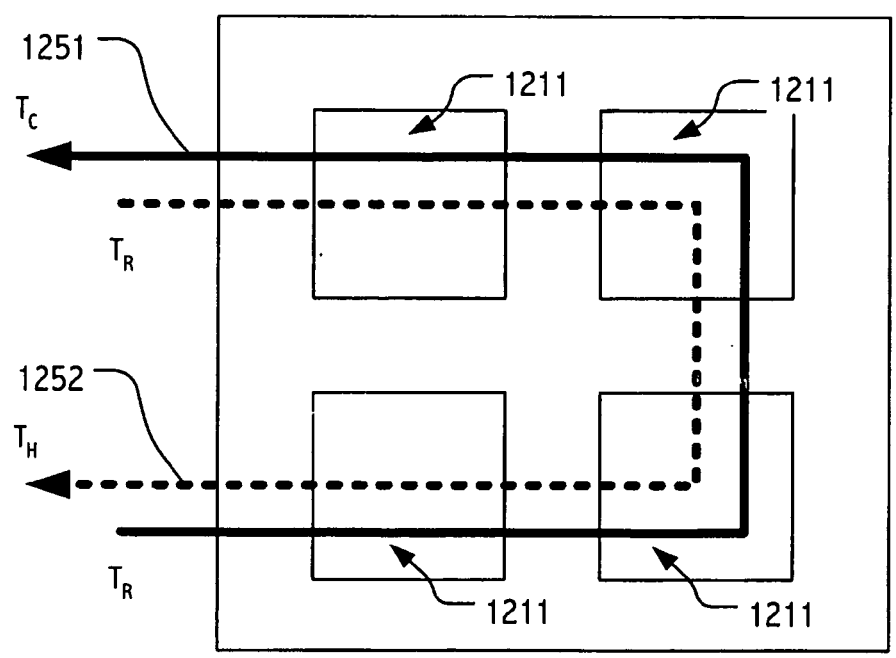
FIG. 12 illustrates a simple counterflow topology in a two-dimensional array of thermoelectric elements.

In some configurations (including linear configurations and two dimensional traversals such as illustrated in FIG. 12), counterdirectional fluid flows may be employed to achieve substantially uniform thermal differentials. In some configurations, other counterflow topologies (including crossflows) may be employed. Generally, an N-stage array or subarray may provide substantially uniform thermal differentials if counterflow topology is structured so that, at any particular thermoelectric module, the impinging hot-side and cold-side flows respectively traverse x and N-1-x stages {x:0≦x<N} enroute to the particular thermoelectric module.

FIG. 12 illustrates in a top-side plan view, a simple counterflow topology for a 2×2 array of thermoelectric modules. Cold-side flow 1251 and hot-side flow 1252 will be understood to be in thermal communication with respective cold-sides and hot-sides of thermoelectric modules 1211. As with the linear arrangements previously described, substantially uniform thermal differentials may be achieved across each of the illustrated thermoelectric modules 1211 based on the illustrated flow topology.

Figure 13:
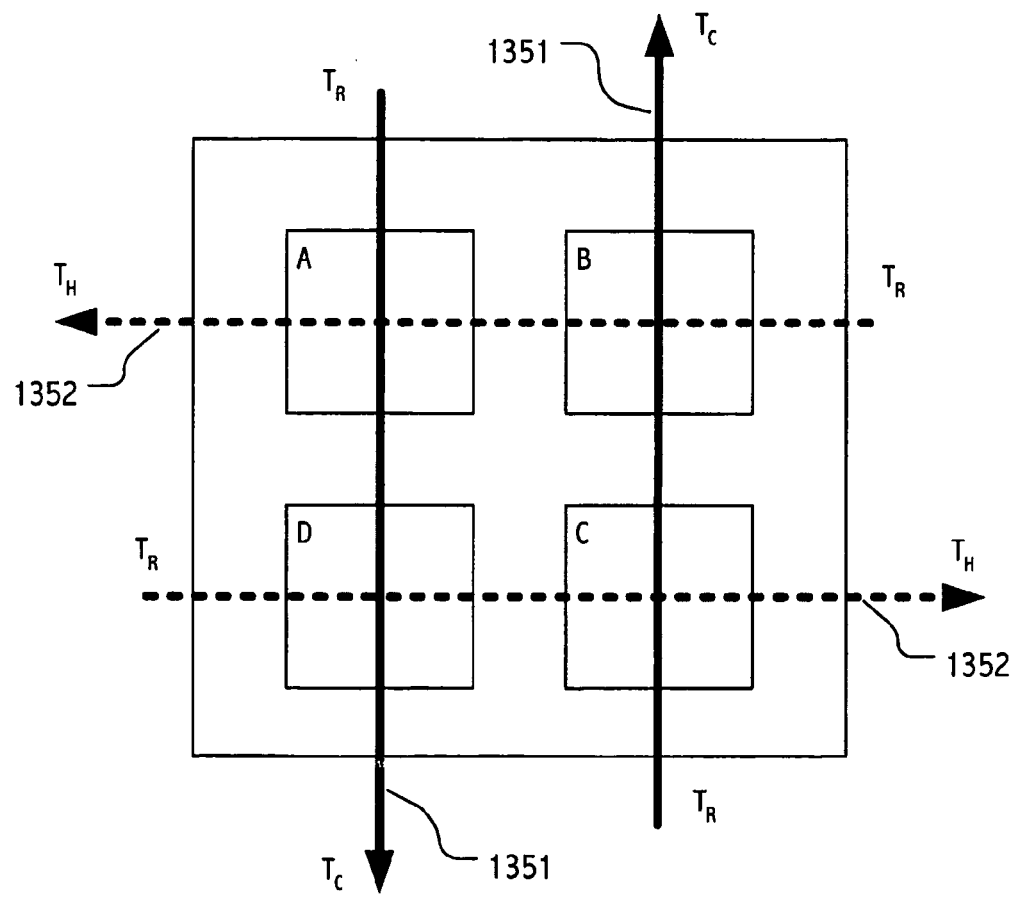
FIG. 13 illustrates another counterflow topology in a two-dimensional array of thermoelectric elements.

FIG. 13 illustrates in a top-side, plan view, another counterflow topology for a simple 2×2 array of thermoelectric elements. Cold-side flows 1351 and hot-side flows 1352 are in thermal communication with respective cold-sides and hot-sides of thermoelectric modules A, B, C and D. Substantially uniform thermal differentials can be achieved across each of the thermoelectric modules based on the illustrated flow topology.

Figure 14:
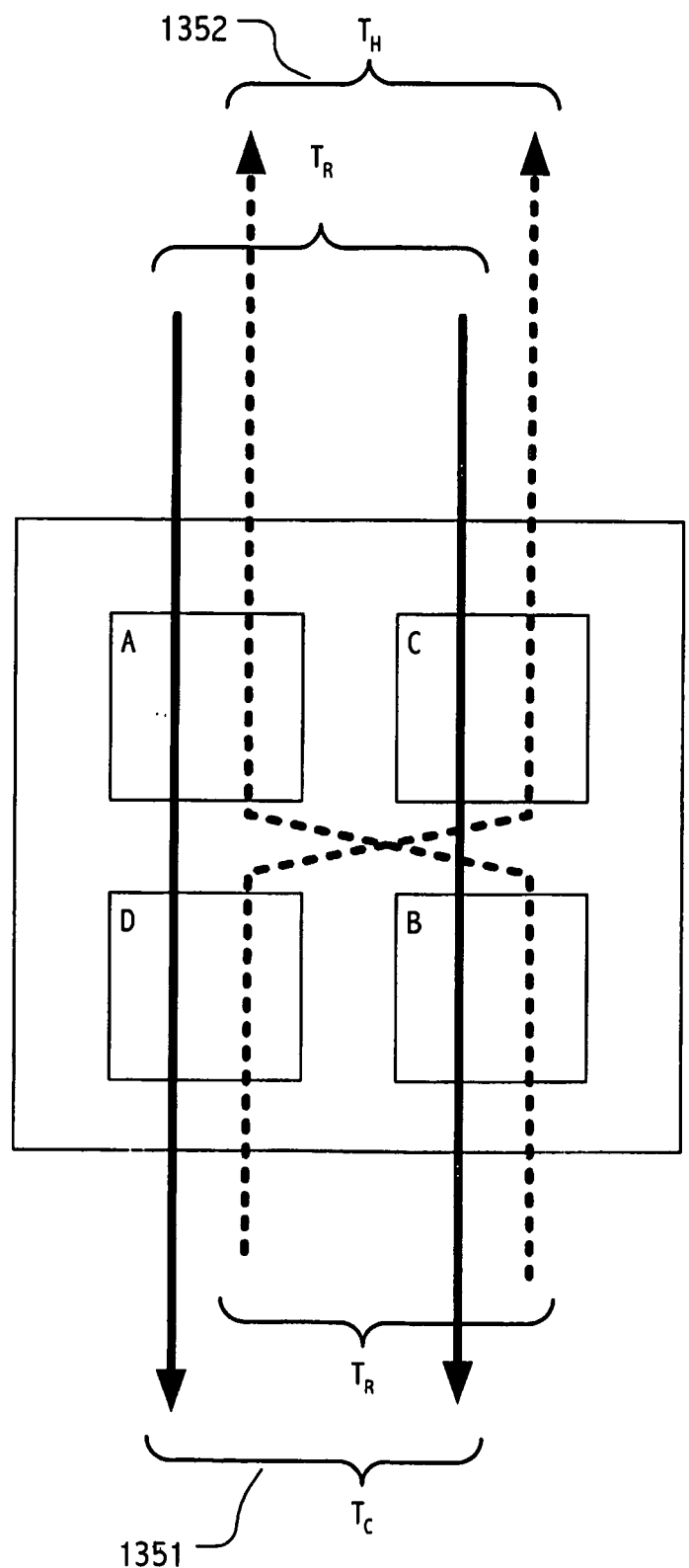
FIGS. 14 and 15 illustrate still other counterflow topologies in a two-dimensional array of thermoelectric elements.
Figure 15:
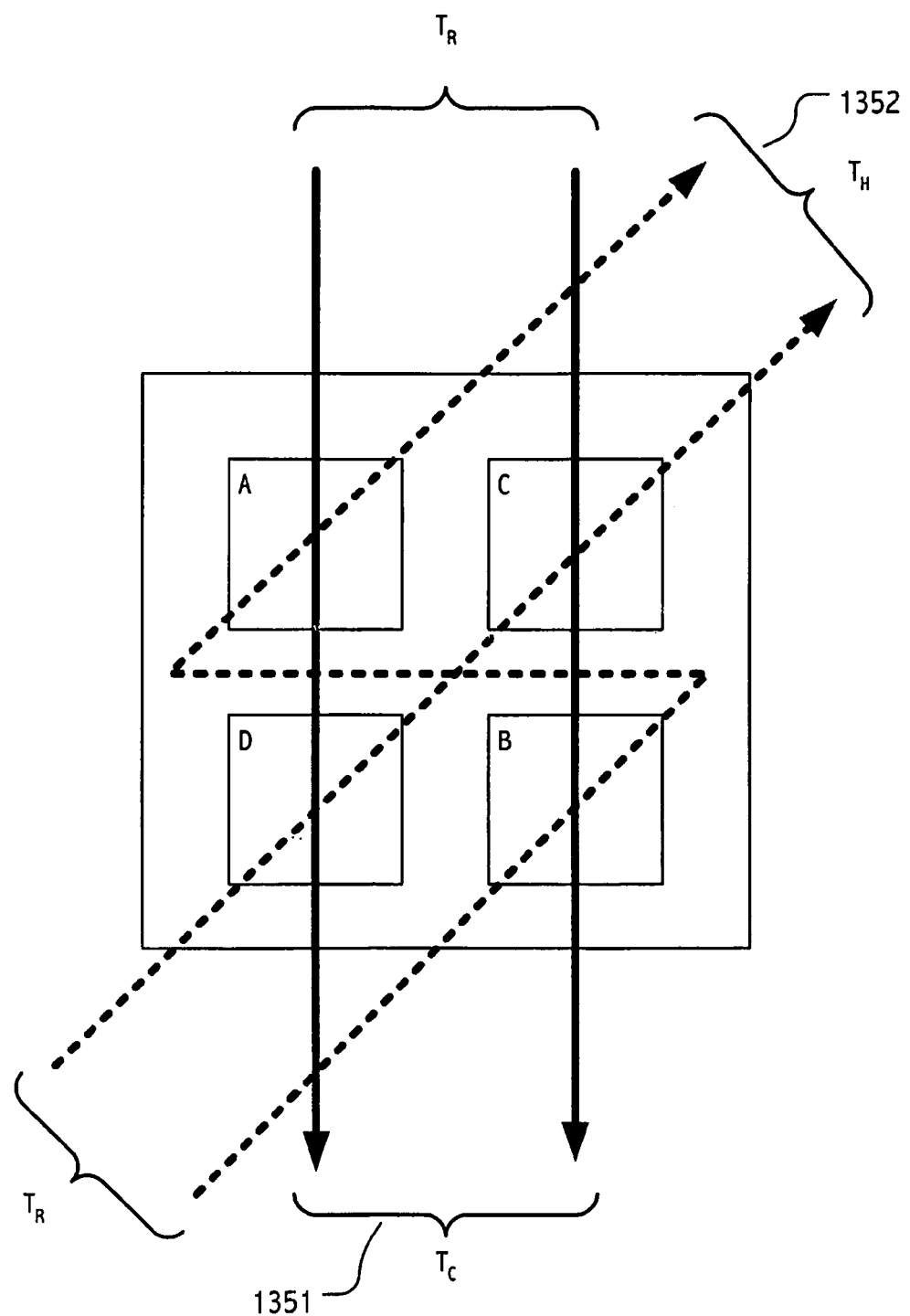

FIGS. 14 and 15 illustrates two topological transformations of the counterflows for the previously illustrated in FIG. 13. The transformations that allow inflows and outflows to be conveniently grouped for efficient routing in a larger system configuration. As before, cold-side flows 1351 and hot-side flows 1352 are in thermal communication with respective cold-sides and hot-sides of thermoelectric modules A, B, C and D.

Figure 16:
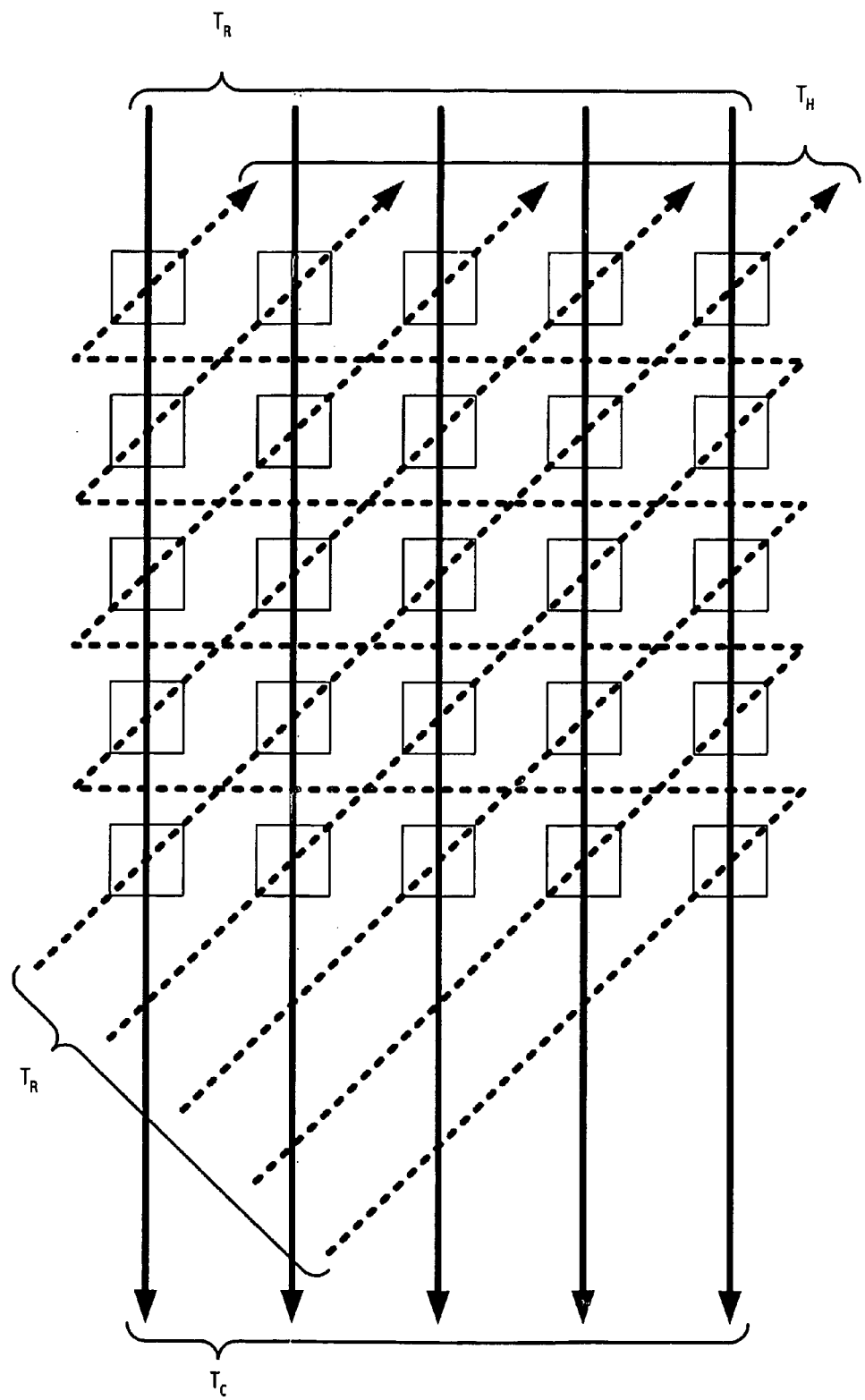
FIGS. 16, 17 and 18 generalize certain of the illustrated counterflow topologies to various n×n, n×m and m×n arrays of thermoelectric elements.
Figure 17:
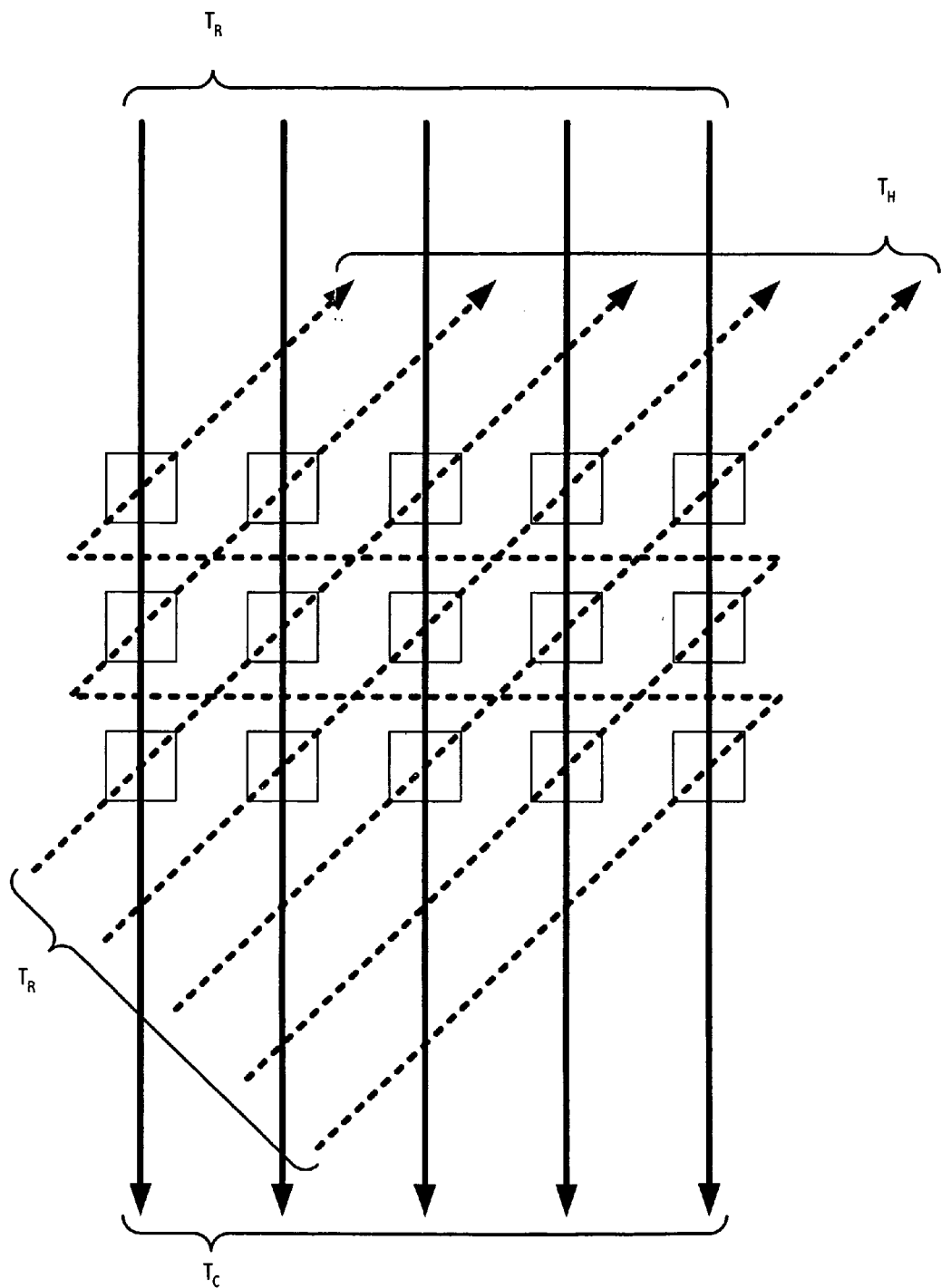
Figure 18:
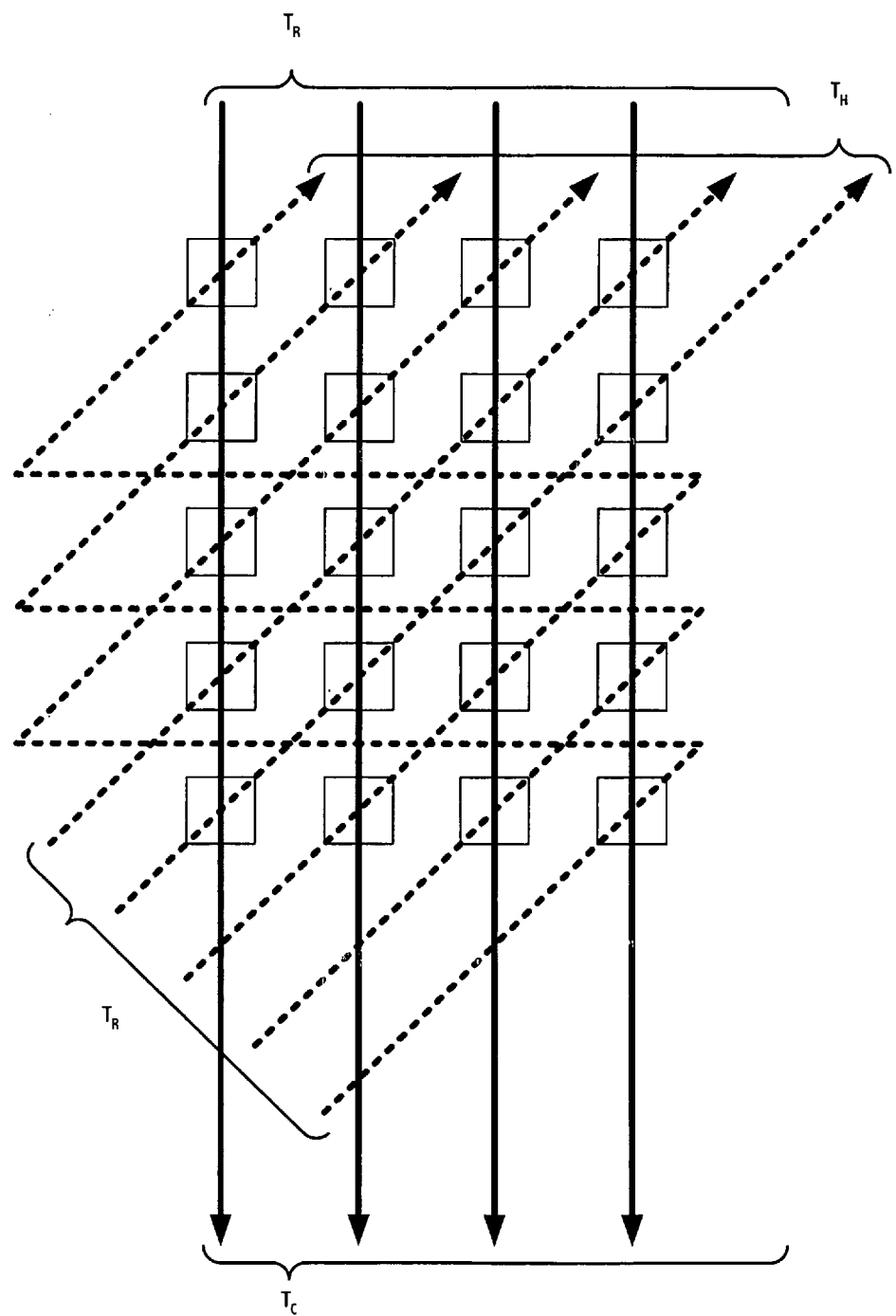

Finally, FIGS. 16, 17 and 18 generalize the previously illustrated counterflow topologies to larger arrays of thermoelectric elements. In particular, FIG. 16 generalizes the previously illustrated flow topology for a 2×2 array to that suitable for an n×n array. FIGS. 17 and 18 generalize the flow topology to that suitable for array without equal number of rows and columns.

Other Embodiments

While the invention(s) is(are) described with reference to various implementations and exploitations, it will be understood that these embodiments are illustrative and that the scope of the invention(s) is not limited to them. Many variations, modifications, additions, and improvements are possible.

For example, while operation of certain configurations has been described in the context of liquid metal thermal transfer fluids and magnetofluiddynamic (MFD) pump configurations, persons of ordinary skill in the art will recognize that alterative thermal transfer fluids including conductive thermal transfer fluids (useful with MFD) pump configurations) and non-conductive thermal transfer fluids and other pump configurations (MFD, electromagnetic or otherwise) may be employed. Similarly, although many of the illustrated configurations are described in the context of a high power density device (HPDD) cooling configuration, it will be apparent that other closed fluid cycle counterflow thermoelectric heat transfer configurations (including cooling, heating, cooling/heating, thermal regulation, power generation, etc.) are all contemplated and that HPDD applications are for illustration only. In general, suitable cooling and/or heating targets and/or sources of substantial thermal differential (e.g., for power generation configurations) are varied and may include targets that are neither dense nor thermal sources. In particular, exploitations of the described thermoelectric systems can include air conditioning and refrigeration.

Furthermore, persons of ordinary skill in the art will appreciate that terms such as cold, colder, hot, hotter and the like are relative terms and do not imply any particular temperature, temperature range or relation to any particular ambient or quiescent temperature. While loop configurations have been described without regard flow to any particular flow timings, rates or the like, persons of ordinary skill in the art will appreciate suitable adaptations for particular thermal loads and heat transfer characteristics of particular heat exchangers and/or thermal transfer fluids employed in a given exploitation.

A variety of alternate placements of components (including pumps, heat exchangers, recuperators, etc.) and thermoelectric module designs are consistent with the preceding description and claims that follow. In particular, thermoelectric modules may include one or more thermoelectric elements (or couples) in a substantially isothermal configuration. The term "thermoelectric" (e.g., thermoelectric module, couple, element, device, material etc.) is meant in the broadest sense of the term in which thermal potential is traded for electromagnetic potential (or vice versa), and therefore includes those thermoelectric configurations which exploit Peltier or Seebeck effects, as well as those that operate based upon Thomson, quantum tunneling, thermoionic, magneto caloric or other similar effect or combination of effects. Additionally, while some configurations have been described primarily with reference to continuous unidirectional flow of thermal transfer fluids, it will be understood that continuous, semi-continuous, unidirectional, substantially unidirectional, variable direction, variable flow rate, intermittent and/or pulsed flows may employed in some realizations without departing from the spirit and scope of the invention(s).

Certain materials or material systems are commonly employed in configurations that exploit particular thermoelectric-type effects. In general, appropriate material selections are based on the particular thermoelectric-type effects exploited and may be optimized for operating temperatures, compatibility with other materials and other factors.

More generally, plural instances may be provided for components, operations or structures described herein as a single instance. Finally, boundaries between various components and particular operations are illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the invention(s).

What is claimed is:

1. A thermoelectric system comprising:
plural thermoelectric modules, each including at least one thermoelectric element and together defining a thermoelectric array, individual ones of the thermoelectric elements having respective first and second sides and exhibiting respective thermal differentials during operation;
a first closed fluid loop pathway portion in thermal communication with the first sides of the thermoelectric elements; and
a second closed fluid loop pathway portion in thermal communication with the second sides of the thermoelectric elements,
wherein a counterflow topology of the first and second closed fluid loop pathway portions is structured to ensure that the respective thermal differentials are substantially uniform during operation with a thermal transfer fluid.

2. The thermoelectric system of claim 1, further comprising:
the thermal transfer fluid disposed within at least one of the first and second closed fluid loop pathway portions.

3. The thermoelectric system of claim 2,
wherein the thermal transfer fluid includes one or more of a liquid metal, a conductive fluid, and a conductive slurry.

4. The thermoelectric system of claim 1, further comprising:
at least one electromagnetic pump to motivate flow of the thermal transfer fluid through one or both of the first and second closed fluid loop pathway portions.

5. The thermoelectric system of claim 1,
wherein the first and second closed fluid loop pathway portions are each part of a respective closed fluid loop for transfer of the thermal transfer fluid away from, and back to, the thermoelectric array.

6. The thermoelectric system of claim 1, further comprising:
two distinct closed fluid loops for transfer of the thermal transfer fluid away from, and back to, the thermoelectric array,
the first closed fluid loop including the first closed fluid loop pathway portion and in thermal communication with the first sides of the thermoelectric elements and
the second closed fluid loop including the second closed fluid loop pathway portion and in thermal communication with the second sides of the thermoelectric elements.

7. The thermoelectric system of claim 6, further comprising,
at least one electromagnetic pump to motivate flow of a liquid metal thermal transfer fluid through the first closed fluid loop portion.

8. The thermoelectric system of claim 7, further comprising,
at least one electromagnetic pump to motivate flow of a liquid metal thermal transfer fluid through the second closed fluid loop pathway portion.

9. The thermoelectric system of claim 1, further comprising:
a single closed loop in thermal communication with both the first and second sides of the thermoelectric elements, the single closed fluid loop including both the first and the second closed fluid loop pathway portions.

10. The thermoelectric system of claim 9,
wherein a single electromagnetic pump is disposed within the single closed loop to motivate flow of a liquid metal thermal transfer fluid through both the first and second closed fluid loop pathway portions.

11. The thermoelectric system of claim 1, further comprising:
two at least partially overlapped closed fluid loops for transfer of the thermal transfer fluid away from, and back to, the thermoelectric array,
the first closed fluid loop including the first closed fluid loop pathway portion and in thermal communication with the first sides of the thermoelectric elements and
the second closed fluid loop including the second closed fluid loop pathway portion and in thermal communication with the second sides of the thermoelectric elements,
wherein thermal transfer fluid from the first and second closed fluid loops is commingled at at least one point in the overlapped closed fluid loops.

12. The thermoelectric system of claim 11, further comprising:
at least one electromagnetic pump disposed in an overlapped portion of the overlapped closed fluid loops.

13. The thermoelectric system of claim 1,
wherein the flow topology traverses N-stages of the thermoelectric array, and
wherein the flow topology is structured so that, at any particular one of the thermoelectric modules, impinging hot-side and cold-side flows respectively traverse x and N-1-x stages $\{x:0 \leq x<N\}$ enroute to the particular thermoelectric module.

14. The thermoelectric system of claim 4,
wherein the at least one electromagnetic pump includes a magnetofluiddynamic (MFD) pump.

15. The thermoelectric system of claim 4,
wherein the at least one electromagnetic pump is continuously operable.

16. The thermoelectric system of claim 4,
wherein the at least one electromagnetic pump is operable periodically or intermittently.

17. The thermoelectric system of claim 1, further comprising:
a recuperator that substantially equilibrates temperature of the thermal transfer fluid entering the first and second closed fluid loop pathway portions.

18. The thermoelectric system of claim 17,
wherein the recuperator commingles fluid flows.

19. The thermoelectric system of claim 17,
wherein the recuperator includes a heat exchanger.

20. The thermoelectric system of claim 1,
wherein a first formulation of the thermal transfer fluid is disposed within the first closed fluid loop pathway portion; and
wherein a second formulation of the thermal transfer fluid is disposed within the second closed fluid loop pathway portion.

21. The thermoelectric system of claim 20,
wherein the first and second formulations are different formulations.

22. The thermoelectric system of claim 20,
wherein the first and second formulations are substantially identical formulations.

23. The thermoelectric system of claim 1, configured to perform one or more of the following:

cool a heat source or target;
heat a target;
at least partially regulate temperature of a heat source or target; and
generate current flow in response to a temperature differential.

24. The thermoelectric system of claim 1, further comprising:
a closed fluid loop including one or both of first and second closed fluid loop pathway portions.

25. The thermoelectric system of claim 24, further comprising either or both of:
a heat sink in thermal communication with the closed fluid loop; and
a heat source or target in thermal communication with the closed fluid loop.

26. The thermoelectric system of claim 1, wherein the thermoelectric array includes:
a linear array; or
a 2-dimensional array.

27. A thermoelectric array configuration that that motivates flow of a liquid metal thermal transfer fluid in a first closed fluid loop using a magnetofluiddynamic (MFD) pump, wherein the motivated flow is part of a counterflow topology structured to ensure that thermal differentials across modules of the thermoelectric array are substantially uniform during operation.

28. The thermoelectric array configuration of claim 27, wherein the first closed fluid loop is in thermal communication with first sides of the modules.

29. The thermoelectric array configuration of claim 28, further comprising:
a second closed fluid loop distinct from the first closed fluid loop, wherein the second closed fluid loop is in thermal communication with second sides of the modules.

30. The thermoelectric array configuration of claim 29, further comprising,
at least one additional MFD pump to motivate flow of the liquid metal thermal transfer fluid through the second closed fluid loop.

31. The thermoelectric array configuration of claim 28, further comprising:
a second closed fluid loop partially overlapped with the first closed fluid loop, wherein the second closed fluid loop is in thermal communication with second sides of the modules.

32. The thermoelectric array configuration of claim 31, wherein liquid metal thermal transfer fluid from the first and second closed fluid loops is commingled at at least one point in an overlapped portion of the first and second closed fluid loops.

33. The thermoelectric array configuration of claim 31, wherein the MFD pump is disposed in an overlapped portion of the first and second closed fluid loops.

34. The thermoelectric array configuration of claim 27, wherein the first closed loop constitutes a single closed loop in thermal communication with both first and second sides of the modules.

35. The thermoelectric array configuration of claim 27, wherein the flow topology traverses N modules of the thermoelectric array, and
wherein the flow topology is structured so that, at any particular one of the modules, impinging hot-side and cold-side flows respectively traverse x and N-1-x stages $\{x: 0 \leq x < N\}$ enroute to the particular module.

36. The thermoelectric array configuration of claim 27, further comprising:
a recuperator that substantially equilibrates temperature of the liquid metal thermal transfer fluid entering the first and second closed fluid loop pathway portions that respectively traverse first and second sides of the modules.

37. The thermoelectric array configuration of claim 36, wherein the recuperator commingles fluid flows.

38. The thermoelectric array configuration of claim 36, wherein the recuperator includes a heat exchanger.

39. A method of operating a thermoelectric system that includes plural thermoelectric modules, each including at least one thermoelectric element and together defining a thermoelectric array, individual ones of the thermoelectric elements having respective first and second sides and exhibiting respective thermal differentials during operation, the method comprising:
motivating flow of a first thermal transfer fluid through a first closed fluid loop pathway portion in thermal communication with the first sides of the thermoelectric elements; and
motivating flow of a second thermal transfer fluid through a second closed fluid loop pathway portion in thermal communication with the second sides of the thermoelectric elements,
wherein topologies of the motivated flows are selected to achieve substantially uniformity of the thermal differentials during operation of the thermoelectric system.

40. The method of claim 39,
wherein the first and second closed fluid loops are distinct.

41. The method of claim 40,
wherein the motivating of respective flows of thermal transfer fluid through respective ones of the first and second closed fluid loops is by operation of respective first and second magnetofluiddynamic (MFD) pumps.

42. The method of claim 39,
wherein the first and second closed fluid loops constitute a single closed fluid loop; and
wherein the first and second thermal transfer fluids are a same fluid.

43. The method of claim 42,
wherein the motivating of respective flows of thermal transfer fluid through the first and second closed fluid loops is by operation of a single magnetofluiddynamic (MFD) pump.

44. The method of claim 39,
wherein the second closed fluid loop is partially overlapped with the first closed fluid loop; and
wherein the first and second thermal transfer fluids are a same fluid.

45. The method of claim 44, further comprising:
commingling the first and second thermal transfer fluids at at least one point in an overlapped portion of the first and second closed fluid loops.

46. The method of claim 44,
wherein the motivating of respective flows of thermal transfer fluid through the first and second closed fluid loops is by operation of at least one magnetofluiddynamic (MFD) pump disposed in an overlapped portion of the first and second closed fluid loops.

47. The method of claim 39, wherein the topologies of the motivated flows traverse N of the thermoelectric modules, the method further comprising:
traversing as part of a first side flow, x stages enroute to a particular module; and traversing as part of a second side flow, N-1-x stages enroute to the particular module, wherein {x:0≦x<N}.

48. The method of claim 39, wherein the topologies of the motivated flows include counterflows.

49. The method of claim 39, further comprising:
substantially equilibrating temperature of thermal transfer fluid entering the first and second closed fluid loop pathway portions.

50. The method of claim 39, further comprising:
commingling thermal transfer fluid flows entering the first and second closed fluid loop pathway portions.

51. The method of claim 39, further comprising:
exchanging heat between thermal transfer fluid flows entering the first and second closed fluid loop pathway portions.

52. A method of making a thermoelectric system product, the method comprising:
providing plural thermoelectric modules, each including at least one thermoelectric element and together defining a thermoelectric array, individual ones of the thermoelectric elements having respective first and second sides;
configuring a first closed fluid loop pathway portion in thermal communication with the first sides of the thermoelectric elements;
configuring a second closed fluid loop pathway portion in thermal communication with the second sides of the thermoelectric elements; and
coupling an electromagnetic pump to at least one of the first and second closed fluid loop pathway portions.

53. A method of making a thermoelectric system product as recited in claim 52, the method further comprising:
closing a first closed fluid loop including one of the first and second closed fluid loop pathway portions.

54. A method of making a thermoelectric system product as recited in claim 52, the method further comprising:
closing a single closed fluid loop including both the first and second closed fluid loop pathway portions.

55. A method of making a thermoelectric system product as recited in claim 52, the method further comprising:
closing at least a first one of two partially overlapped closed fluid loops, the first closed fluid loop including one of the first and second closed fluid loop pathway portions.

56. A method of making a thermoelectric system product as recited in claim 52, the method further comprising:
introducing a thermal transfer fluid into a closed fluid loop that includes one or both of the first and second closed fluid loop pathway portions.

57. A method of making a thermoelectric system product as recited in claim 52,
wherein the providing includes providing N of the thermoelectric modules; and
wherein the configuring of first and second closed fluid pathway portions includes
causing the first closed fluid pathway portion to traverse x of the thermoelectric modules enroute to any particular one of the thermoelectric modules; and
causing the second closed fluid pathway portion to traverse N-1-x of the thermoelectric modules enroute to the particular module, wherein {x0≦x<N}.

58. A method of making a thermoelectric system product as recited in claim 52,
wherein the configuring of first and second closed fluid pathway portions includes defining a counterflow topology.

59. A method of making a thermoelectric system product as recited in claim 52, the method further comprising:
positioning a recuperator to substantially equilibrate temperature of thermal transfer fluid destined for the first and second closed fluid loop pathway portions.

60. A method of making a thermoelectric system product as recited in claim 52, the method further comprising:
thermally coupling a closed fluid loop to a heat source, the closed fluid loop including one or both of the first and second closed fluid loop pathway portions.

61. A method of making a thermoelectric system product as recited in claim 52, the method further comprising:
thermally coupling a closed fluid loop to a heat sink, the closed fluid loop including one or both of the first and second closed fluid loop pathway portions.

62. A method of making a thermoelectric system product as recited in claim 52, the method further comprising:
thermally coupling a closed fluid loop to a thermal regulation target, the closed fluid loop including one or both of the first and second closed fluid loop pathway portions.

63. An apparatus comprising:
plural thermoelectric modules, each including at least one thermoelectric element and together defining a thermoelectric array;
means for motivating flow of an electrically-conductive thermal transfer fluid away from, or back to, the thermoelectric array; and
means for defining a flow topology that ensures that respective thermal differentials across modules of the thermoelectric array are substantially uniform during operation.

64. The apparatus of claim 63, further comprising:
means for guiding flow of the electrically-conductive thermal transfer fluid in at least one closed fluid cycle.

65. The apparatus of claim 63, further comprising:
means for exchanging thermal energy between the electrically-conductive thermal transfer fluid and a heat source, target or sink.

66. The apparatus of claim 63, further comprising:
means for substantially equilibrating temperature of the electrically-conductive thermal transfer fluid destined for respective sides of the thermoelectric array.

* * * * *